US009639309B1

(12) United States Patent
    Pugh

(10) Patent No.: US 9,639,309 B1
(45) Date of Patent: *May 2, 2017

(54) IMAGE CONVERSION METHODS

(71) Applicant: KYOCERA Document Solutions Inc., Osaka (JP)

(72) Inventor: Eric Pugh, Torrance, CA (US)

(73) Assignee: KYOCERA Document Solutions Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/883,566

(22) Filed: Oct. 14, 2015

(51) Int. Cl.
    *G06F 3/12* (2006.01)
(52) U.S. Cl.
    CPC .......... *G06F 3/1245* (2013.01); *G06F 3/1206* (2013.01); *G06F 3/1288* (2013.01)
(58) Field of Classification Search
    CPC ..... G06F 3/1245; G06F 3/1206; G06F 3/1288
    USPC ........................................................ 358/1.15
    See application file for complete search history.

(56) References Cited

U.S. PATENT DOCUMENTS

| 6,919,825 B2 | 7/2005 | Su et al. |
| 7,477,788 B2 | 1/2009 | Nomizu |
| 2004/0105587 A1 | 6/2004 | Nomizu |
| 2006/0044576 A1 | 3/2006 | Tabata et al. |
| 2006/0132819 A1* | 6/2006 | Shin ...................... G06F 3/1204 358/1.13 |
| 2014/0268194 A1 | 9/2014 | Pugh et al. |

OTHER PUBLICATIONS

E. Pugh, "Image Conversion Methods", U.S. Appl. No. 14/883,559, filed Oct. 14, 2015.

* cited by examiner

*Primary Examiner* — Marivelisse Santiago Cordero
*Assistant Examiner* — Neil R McLean
(74) *Attorney, Agent, or Firm* — McDonnell Boehnen Hulbert & Berghoff LLP

(57) ABSTRACT

Methods and apparatus for image conversion are provided. A computing device can receive image data having line(s) of pixels encoded using a first format. The first format can specify a repeat count for a corresponding line of pixels. The computing device can convert the image data from the first format to a second format. The conversion can include: for a designated input line, determining whether the repeat count for the designated input line is greater than one; and after determining that the repeat count is greater than one: generating a designated output line encoded in the second run-length encoded format that corresponds to the designated input line, and duplicating the designated output line a number of times based on the repeat count. The computing device can provide an output comprising the image data encoded in the second format.

20 Claims, 13 Drawing Sheets

Color Matrix 410

| Line # | Pixel Column |   |   |   |   |   |   |   |
|---|---|---|---|---|---|---|---|---|
|  | 1 | 2 | 3 | 4 | 5 | 6 | 7 | 8 |
| 1 | W | W | W | W | W | W | W | W |
| 2 | W | W | R | W | W | W | W | W |
| 3 | W | R | B | G | W | W | W | W |
| 4 | W | W | G | G | W | G | B | W |
| 5 | Y | Y | Y | W | R | R | R | W |
| 6 | B | B | B | B | B | B | B | B |
| 7 | G | G | G | G | G | G | G | G |
| 8 | R | R | R | R | R | R | R | R |

Table 412

| Pixel | Color | Red Plane | Green Plane | Blue Plane |
|---|---|---|---|---|
| W | White | 0xFF | 0xFF | 0xFF |
| R | Red | 0xFF | 0x00 | 0x00 |
| G | Green | 0x00 | 0xFF | 0x00 |
| B | Blue | 0x00 | 0x00 | 0xFF |
| Y | Yellow | 0xFF | 0xFF | 0x00 |

Interleaved Pixel Column (hex values) — Interleaved Color Data 420

| Line | 1 | 2 | 3 | 4 | 5 | 6 | 7 | 8 |
|---|---|---|---|---|---|---|---|---|
| 1 | FF FF FF | FF FF FF | FF FF FF | FF FF FF | FF FF FF | FF FF FF | FF FF FF | FF FF FF |
| 2 | FF FF FF | FF FF FF | FF FF FF | FF FF FF | FF FF FF | FF FF FF | FF FF FF | FF FF FF |
| 3 | FF 00 00 | 00 00 FF | 00 FF 00 | FF FF FF | FF FF FF | FF FF FF | FF FF FF | FF FF FF |
| 4 | FF FF FF | 00 00 FF | 00 FF 00 | FF FF 00 | FF FF FF | FF FF FF | FF FF FF | FF FF FF |
| 5 | FF FF 00 | FF FF 00 | FF FF 00 | FF FF FF | FF 00 00 | FF 00 00 | FF 00 00 | FF FF FF |
| 6 | 00 00 FF | 00 00 FF | 00 00 FF | 00 00 FF | 00 00 FF | 00 00 FF | 00 00 FF | 00 00 FF |
| 7 | 00 FF 00 | 00 FF 00 | 00 FF 00 | 00 FF 00 | 00 FF 00 | 00 FF 00 | 00 FF 00 | 00 FF 00 |
| 8 | FF 00 00 | FF 00 00 | FF 00 00 | FF 00 00 | FF 00 00 | FF 00 00 | FF 00 00 | FF 00 00 |

FIG. 4A

Red Plane Data 422

| | | \multicolumn{8}{c|}{Red Pixel Column (hex values)} |
|---|---|---|---|---|---|---|---|---|---|

| | | Red Pixel Column (hex values) | | | | | | | |
|---|---|---|---|---|---|---|---|---|---|
| | | 1 | 2 | 3 | 4 | 5 | 6 | 7 | 8 |
| Line | 1 | FF | FF | FF | FF | FF | FF | FF | FF |
| | 2 | FF | FF | FF | FF | FF | FF | FF | FF |
| | 3 | FF | 00 | 00 | FF | FF | FF | FF | FF |
| | 4 | FF | 00 | 00 | 00 | FF | 00 | 00 | FF |
| | 5 | FF | FF | FF | FF | FF | FF | FF | FF |
| | 6 | 00 | 00 | 00 | 00 | 00 | 00 | 00 | 00 |
| | 7 | 00 | 00 | 00 | 00 | 00 | 00 | 00 | 00 |
| | 8 | FF | FF | FF | FF | FF | FF | FF | FF |

Green Plane Data 424

| | | Green Pixel Column (hex values) | | | | | | | |
|---|---|---|---|---|---|---|---|---|---|
| | | 1 | 2 | 3 | 4 | 5 | 6 | 7 | 8 |
| Line | 1 | FF | FF | FF | FF | FF | FF | FF | FF |
| | 2 | FF | FF | FF | FF | FF | FF | FF | FF |
| | 3 | 00 | 00 | FF | FF | FF | FF | FF | FF |
| | 4 | FF | FF | FF | FF | FF | 00 | 00 | FF |
| | 5 | FF | FF | FF | FF | 00 | 00 | 00 | FF |
| | 6 | 00 | 00 | 00 | 00 | 00 | 00 | 00 | 00 |
| | 7 | FF | FF | FF | FF | FF | FF | FF | FF |
| | 8 | 00 | 00 | 00 | 00 | 00 | 00 | 00 | 00 |

Blue Plane Data 426

| | | Blue Pixel Column (hex values) | | | | | | | |
|---|---|---|---|---|---|---|---|---|---|
| | | 1 | 2 | 3 | 4 | 5 | 6 | 7 | 8 |
| Line | 1 | FF | FF | FF | FF | FF | FF | FF | FF |
| | 2 | FF | FF | FF | FF | FF | FF | FF | FF |
| | 3 | 00 | FF | 00 | FF | FF | FF | FF | FF |
| | 4 | FF | 00 | 00 | 00 | FF | FF | FF | FF |
| | 5 | 00 | 00 | 00 | FF | 00 | 00 | 00 | FF |
| | 6 | FF | FF | FF | FF | FF | FF | FF | FF |
| | 7 | 00 | 00 | 00 | 00 | 00 | 00 | 00 | 00 |
| | 8 | 00 | 00 | 00 | 00 | 00 | 00 | 00 | 00 |

FIG. 4B

Compression Format 1 (CF1) Summary 430:
1. A CF1 encoded line is of the form CC C1 [data1 [C2 [data2 ...]]], where CC, C1, C2... are bytes as follows. Each line begins with count byte CC, where the line is repeated CC+1 times. CC range = 0x00 to 0xFF (0 – 255 decimal).
2. Operation codes C1, C2... can include:
    a. C1 RR GG BB, for C1 = [0x00,0x7F] (0-127 decimal). Indicates repeat of pixel data "RR GG BB" C1+1 times.
    b. C1, for C1 = 0x80 (decimal 128). Indicates white space to end of line.
    c. C1 R1 G1 B1 R2 G2 B2 ..., for C1 = [0x81,0xFF] (129-257 decimal). Used to indicate 257-C1 non-repeating pixels R1 G1 B1 R2 G2 B2...

CF1 Encoded Interleaved Color Data 432

| Pixel Line | | |
|---|---|---|
| | 1 | 01 80 |
| | 2 | |
| | 3 | 00 FE FF 00 00 00 00 FF 00 FF 00 80 |
| | 4 | 00 00 FF FF FF 02 00 FF 00 00 FF FF FF 01 00 00 FF 80 |
| | 5 | 00 02 FF FF 00 00 FF FF FF 02 FF 00 00 80 |
| | 6 | 00 07 00 00 FF |
| | 7 | 00 07 00 FF 00 |
| | 8 | 00 07 FF 00 00 |

CF1 Encoded Red Plane Data 434

| Row | | |
|---|---|---|
| | 1 | 01 80 |
| | 2 | |
| | 3 | 00 00 FF 01 00 80 |
| | 4 | 00 00 FF 02 00 00 FF 01 00 80 |
| | 5 | 00 80 |
| | 6 | 01 07 00 |
| | 7 | |
| | 8 | 00 80 |

CF1 Encoded Green Plane Data 436

| Row | | |
|---|---|---|
| | 1 | 01 80 |
| | 2 | |
| | 3 | 00 01 00 80 |
| | 4 | 00 04 FF 01 00 80 |
| | 5 | 00 03 FF 02 00 80 |
| | 6 | 00 07 00 |
| | 7 | 00 80 |
| | 8 | 00 07 00 |

CF1 Encoded Blue Plane Data 438

| Row | | |
|---|---|---|
| | 1 | 01 80 |
| | 2 | |
| | 3 | 00 FE 00 FF 00 80 |
| | 4 | 00 00 FF 02 00 80 |
| | 5 | 00 02 00 00 FF 02 00 80 |
| | 6 | 00 80 |
| | 7 | 01 07 00 |
| | 8 | |

CF2 Format Summary 440
1. A line is of the form OP1 | v1 [OP2 | v2 ...]]],
where OP1, OP2 ... are opcodes, "|" is logical OR, and v1, v2.. are values.
2. There are six opcodes: (L), (NS), (NR), (M), EOLN, and an Escape code.
   a. Conventions:
      1. V = current pixel value represented as 8-bit byte,
      2. P = previous pixel value
      3. RL = run length = number of consecutive pixel values equal to V
      4. Delta = V – P
   b. Opcode L is for a Literal pixel value (byte) to encode V.
      1. Encoded using 10 bits.
      2. Format: L (2 bits) | V (8 bits), with L = 0x200.
   c. Opcode NS is for a Near Match Single.
      1. Used if Delta if in range [-16,15] for exactly two values.
      2. Encoded using 6 bits.
      3. Format: NS (1 bit) | Delta (5 bits), with NS = 0x00.
   d. Opcode NR is for a Near Match Repeat.
      1. Near match encodes Delta if in range [-16,15] and if RL = [2,4].
      2. Encoded using 9 bits.
      3. Format: NR (2 bits) | (RL -1)*32 (2 bits) | Delta (5 bits), NR = 0x180.
   e. Opcode M is for a Match, when V = P.
      1. Match indicates number of pixels equal to the preceding literal.
      2. If RL is [1, 3], then output literal followed by Short Match.
         (a) Short Match encoded using 6 bits
         (b) Format: SMOP | RL – 1 (2 bits), with SMOP = 0x3c.
      3. If RL ≥ 4, then output by literal followed by a long match.
         (a) Long Match encoded using 16 bits
         (b) Format: LMOP | RL – 4 (10 bits), where LMOP = 0xFC00.
   f. EOLN – end of line code = 0x00 (8 bits) Double EOLN = end of file.
   g. Escape - enables mode switching = 0x03 (8 bits)

FIG. 4D

| Color Matrix Excerpt 410p1 | | | | | | | | |
|---|---|---|---|---|---|---|---|---|
| | 1 | 2 | 3 | 4 | 5 | 6 | 7 | 8 |
| Lines 1 | W | W | W | W | W | W | W | W |
| Lines 2 | W | W | W | W | W | W | W | W |

| CF1 Encoded Interleaved Color Data Excerpt 432p1 | |
|---|---|
| Lines 1 | 01 80 |
| Lines 2 | |

400

---

Example 486
1. Copy Input Option Example (Blocks 468- 472 of Method 450)
2. For one pixel line of size 8, the CF1 input of 0x80 = one line having 24 0xFF's
3. Duplicate input line once since CC = 1 -> two lines having 48 FF's
4. For CF2 -> Literal FF + Long Match of 47 FF's + End of Line
5. Literal FF = 0x2FF (10 bits) = 1011111111
6. Long Match of 47 = 0xFC00 | (47 – 4) = 0xFC2B (16 bits) = 1111110000101011
7. End of Line = 0x00 (8 bits) = 00000000
8. Concatenated Bit String 10111111111111110000101011 00000000
9. Bit String Padded to 32-bit Words:
   1011 1111 1111 1111 0000 1010 1100 0000
   0000 0000 0000 0000 0000 0000 0000 0000
10. Little Endian Sequencing: BF FF 0A C0 00 00 00 00
11. Big Endian Sequencing: : C0 0A FF BF 00 00 00 00

---

Example 488
1. Copy Output Option Example (Blocks 474- 478 of Method 450)
2. For one pixel line of size 8, the CF1 input of 0x80 = 24 x FF
3. For CF2 -> Literal FF + Long Match of 23 FF's + End of Line
4. Literal FF = 0x2FF (10 bits) = 1011111111
5. Long Match of 23 = 0xFC00 | (23 – 4) = 0xFC13 (16 bits) = 1111110000010011
6. End of Line = 0x00 (8 bits) = 00000000
7. Concatenated Bit String 1011 1111 11111111000001001100000000
8. Bit String Padded for 32-bit Words
   1011 1111 1111 1111 0000 0100 1100 0000
   0000 0000 0000 0000 0000 0000 0000 0000
9. Duplicate output line once since CC = 1:
   1011 1111 1111 1111 0000 0100 1100 0000
   0000 0000 0000 0000 0000 0000 0000 0000
   1011 1111 1111 1111 0000 0100 1100 0000
   0000 0000 0000 0000 0000 0000 0000 0000
10. Little Endian Sequencing: BF FF 04 C0 00 00 00 00 BF FF 04 C0 00 00 00 00
11. Big Endian Sequencing: C0 04 FF BF 00 00 00 00 C0 04 FF BF 00 00 00 00

FIG. 4F

| Green Plane Row 5 Excerpt 424p | | | | | | | |
|---|---|---|---|---|---|---|---|
| 1 | 2 | 3 | 4 | 5 | 6 | 7 | 8 |
| FF | FF | FF | FF | 00 | 00 | 00 | FF |

CF1 Green Plane Row 5 Excerpt 436p

| Row 5 | 00 03 FF 02 00 80 |
|---|---|

Example 494
1. CF1 Input: 00 03 FF 02 00 80
2. CF2 Output: Literal FF + Short Match of 3 + Literal 00 + Short Match of 2 + Literal FF + End of Line
3. Literal FF = 0x2FF (10 bits) = 1011111111
4. Short Match of 3 = 0x3C | 2 (6 bits) = 111110
5. Literal 00 = 0x200 (10 bits) = 1000000000
6. Short Match of 2 = 0x3C | 1 (6 bits) = 111101
7. Literal FF = 0x2FF (10 bits) = 1011111111
8. End of Line = 0x00 (8 bits) = 00000000
9. Concatenated Bit String
10111111111101000000000011111011011011111111
00000000
10. Bit String Padded to 32-bit Words:
1011 1111 1111 1110 1000 0000 0011 1101
1011 1111 1100 0000 0000 0000 0000 0000
11. Little Endian Sequencing:
BF FE 80 3D BF C0 00 00
12. Big Endian Sequencing:
3D 80 FE BF 00 00 C0 BF

| Blue Plane Row 5 Excerpt 426p | | | | | | | |
|---|---|---|---|---|---|---|---|
| 1 | 2 | 3 | 4 | 5 | 6 | 7 | 8 |
| 00 | 00 | 00 | 00 | FF | 00 | 00 | FF |

CF1 Blue Plane Row 5 Excerpt 438p

| 00 02 00 00 FF 02 00 80 |
|---|

Example 496
1. CF1 Input: 00 02 00 00 FF 02 00 80
2. CF2 Output:
Literal 00 + Short Match of 2 + Literal FF + Literal 00 + Short Match of 2 + Literal FF + End of Line
3. Literal 00 = 0x200 (10 bits) = 1000000000
4. Short Match of 2 = 0x3C | 1 (6 bits) = 111101
5. Literal FF = 0x2FF (10 bits) = 1011111111
6. Literal 00 = 0x200 (10 bits) = 1000000000
7. Short Match of 2 = 0x3C | 1 (6 bits) = 111101
8. Literal FF = 0x2FF (10 bits) = 1011111111
9. End of Line = 0x00 (8 bits) = 00000000
10. Concatenated Bit String
1000000000111101101111111110000000001111011
01111111100000000
11. Bit String Padded to 32-bit Words:
1000 0000 0011 1101 1011 1111 1110 0000
0000 1111 0110 1111 1111 0000 0000 0000
12. Little Endian Sequencing:
80 3D BF E0 0F 6F F0 00
13. Big Endian Sequencing:
E0 BF 3D 80 00 F0 6F 0F

FIG. 4H

IMAGE CONVERSION METHODS

BACKGROUND

Printing devices have increased in number and geographic footprint throughout the world and have become increasingly connected to networks. These networks can include a print server. Typically, when one or more documents and/or other print data are scheduled to be printed, the print data is either directly sent to one printing device, or sent to a print server.

The networks can include many printing devices. Some or all of the printing devices can have different features, functions, and capabilities. For example, some printing devices print in color, while others do not. As another example, some printing devices are equipped with duplexing hardware that allows printing on both sides of a sheet of paper, while other printing devices can only print on one side of a sheet of paper.

Printing devices can print data, such as image data, that is encoded in one or more formats. Examples of these formats include Kyocera Page Description Language (KPDL), Printer Command Language (PCL), Portable Document Format (PDF), the generic Page Description Language (PDL), and PostScript. Other formats are possible as well.

SUMMARY

In one aspect, a method is provided. Image data encoded using a first run-length encoded format is received. The image data includes one or more lines of pixels. The first run-length encoded format includes a repeated-line code specifying a repeat count. A conversion of the image data from the first run-length encoded format to a second run-length encoded format is performed, where the second run-length encoded format differs from the first run-length encoded format. Performing the conversion includes: for a designated input line of the image data encoded in the first run-length encoded format, determining whether the repeat count for the designated input line is greater than one. Then, performing the conversion also includes: after determining that the repeat count is greater than one, generating a designated output line that is encoded in the second run-length encoded format and that corresponds to the designated input line and duplicating the designated output line a number of times, where the number of times is based on the repeat count. An output is provided that includes the image data encoded in the second run-length encoded format.

In another aspect, a computing device is provided. The computing device includes one or more processors and data storage. The data storage is configured to store computer-readable instructions that, when executed by the one or more processors, cause the computing device to perform functions. The functions include: receiving image data encoded using a first run-length encoded format, where the image data includes one or more lines of pixels, and where the first run-length encoded format includes a repeated-line code specifying a repeat count; performing a conversion of the image data from the first run-length encoded format to a second run-length encoded format, where the second run-length encoded format differs from the first run-length encoded format, and where performing the conversion includes: for a designated input line of the image data encoded in the first run-length encoded format, determining whether the repeat count for the designated input line is greater than one; and after determining that the repeat count is greater than one, generating a designated output line that is encoded in the second run-length encoded format and that corresponds to the designated input line, and duplicating the designated output line a number of times, where the number of times is based on the repeat count; and providing an output including the image data encoded in the second run-length encoded format.

In another aspect, an article of manufacture is provided. The article of manufacture includes a non-transitory computer readable medium that is configured to store computer-readable instructions. The computer-readable instructions, when executed by one or more processors of a computing device, cause the computing device to perform functions. The functions include: receiving image data encoded using a first run-length encoded format, where the image data includes one or more lines of pixels, and where the first run-length encoded format includes a repeated-line code specifying a repeat count; performing a conversion of the image data from the first run-length encoded format to a second run-length encoded format, where the second run-length encoded format differs from the first run-length encoded format, and where performing the conversion includes: for a designated input line of the image data encoded in the first run-length encoded format, determining whether the repeat count for the designated input line is greater than one; and after determining that the repeat count is greater than one, generating a designated output line that is encoded in the second run-length encoded format and that corresponds to the designated input line, and duplicating the designated output line a number of times, where the number of times is based on the repeat count; and providing an output including the image data encoded in the second run-length encoded format.

In one aspect, a method is provided. Image data encoded using a first run-length encoded format is received. The image data includes one or more lines of pixels. The first run-length encoded format includes a repeated-line code specifying a repeat count for a corresponding line of pixels of image data. A conversion of the image data from the first run-length encoded format to a second run-length encoded format is performed, where the second run-length encoded format differs from the first run-length encoded format. Performing the conversion includes: for a designated input line of the image data encoded in the first run-length encoded format, determining whether the repeat count for the designated input line is greater than one. Then, performing the conversion also includes: decompressing the designated input line of the image data into a decompressed line of image data, duplicating the decompressed line of image data a number of times, where the number of times is based on the repeat count, and generating designated output lines of image data that are encoded in the second run-length encoded format and that correspond to the duplicated decompressed lines of image data. An output is provided that includes the image data encoded in the second run-length encoded format.

In another aspect, a computing device is provided. The computing device includes one or more processors and data storage. The data storage is configured to store computer-readable instructions that, when executed by the one or more processors, cause the computing device to perform functions. The functions include: receiving image data encoded using a first run-length encoded format, where the image data includes one or more lines of pixels, and where the first run-length encoded format includes a repeated-line code specifying a repeat count for a corresponding line of pixels of image data; performing a conversion of the image data from the first run-length encoded format to a second run-length encoded format, where the second run-length encoded format differs from the first run-length encoded format, and where performing the conversion includes: for a designated input line of the image data encoded in the first run-length encoded format, determining whether the repeat count for the designated input line is greater than one; and after determining that the repeat count is greater than one: decompressing the designated input line of the image data into a decompressed line of image data, duplicating the decompressed line of image data a number of times, where the number of times is based on the repeat count, and generating designated output lines of image data that are encoded in the second run-length encoded format and that correspond to the duplicated decompressed lines of image data; and providing an output including the image data encoded in the second run-length encoded format.

In another aspect, an article of manufacture is provided. The article of manufacture includes a non-transitory computer readable medium that is configured to store computer-readable instructions. The computer-readable instructions, when executed by one or more processors of a computing device, cause the computing device to perform functions. The functions include: receiving image data encoded using a first run-length encoded format, where the image data includes one or more lines of pixels, and where the first run-length encoded format includes a repeated-line code specifying a repeat count for a corresponding line of pixels of image data; performing a conversion of the image data from the first run-length encoded format to a second run-length encoded format, where the second run-length encoded format differs from the first run-length encoded format, and where performing the conversion includes: for a designated input line of the image data encoded in the first run-length encoded format, determining whether the repeat count for the designated input line is greater than one; and after determining that the repeat count is greater than one: decompressing the designated input line of the image data into a decompressed line of image data, duplicating the decompressed line of image data a number of times, where the number of times is based on the repeat count, and generating designated output lines of image data that are encoded in the second run-length encoded format and that correspond to the duplicated decompressed lines of image data; and providing an output including the image data encoded in the second run-length encoded format.

Other aspects, embodiments, and implementations will become apparent to those of ordinary skill in the art by reading the following detailed description, with reference where appropriate to the accompanying drawings.

BRIEF DESCRIPTION OF THE FIGURES

FIGS. 4A-4H illustrate an example scenario for converting image data compressed using an input run-length encoded format to the same image data compressed using an output run-length encoded format, according to an example embodiment.

DETAILED DESCRIPTION

Figure 1:
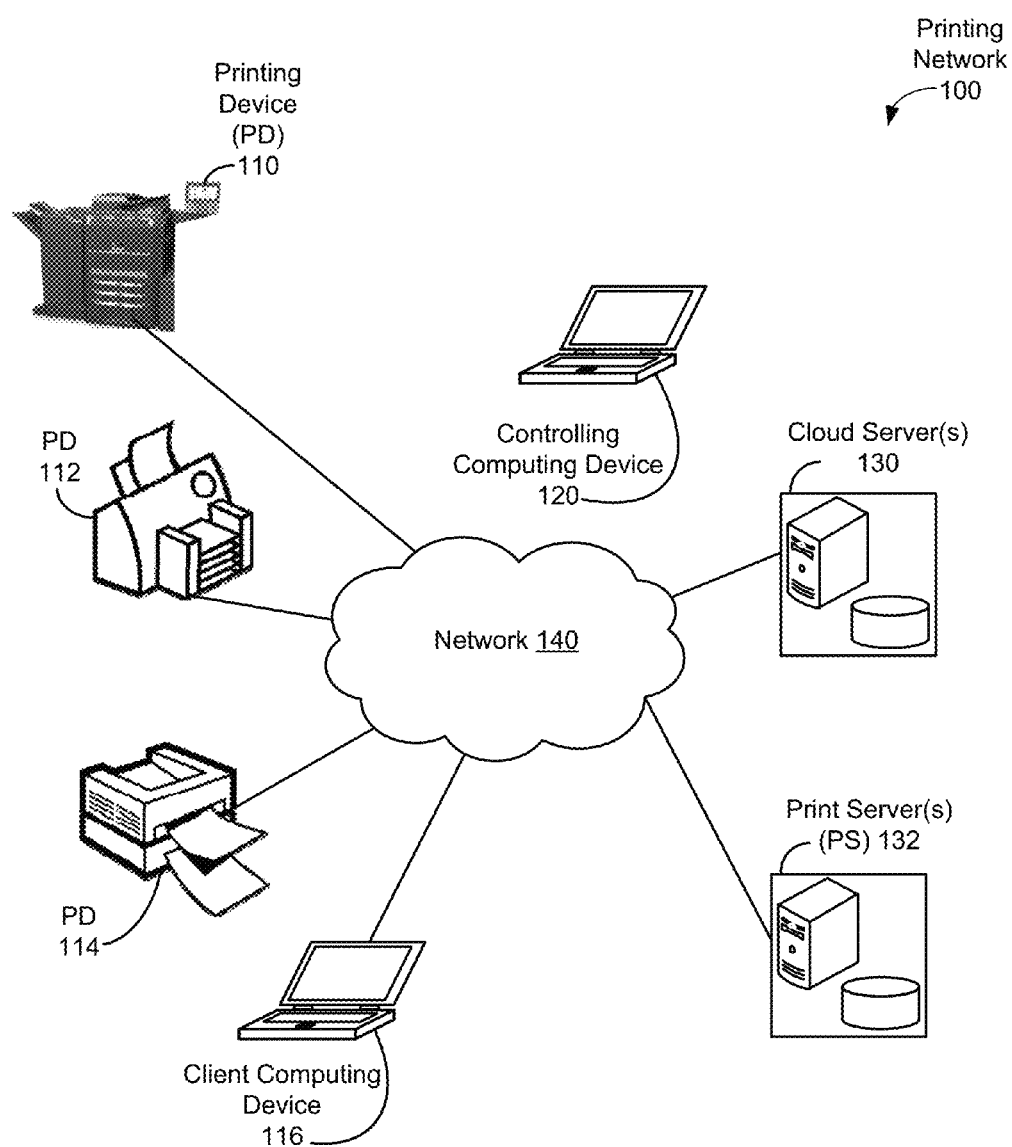
FIG. 1 is a diagram illustrating a printing network, according to an example embodiment.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

I. Overview

Example apparatus and methods are described herein related to converting data between run-length encoded (RLE) formats. Run-length encoding is a form of data compression where a "run" or sequences of repeated data values are converted into a count (or length) and data value representation. In some examples, RLE can significantly reduce the size of the represented data. For example, the string "xxxxxx" can be represented as "6x", where "6" is the count/length of the run and the "x" is the repeated data value. In implementations where integers can be stored in two bytes and characters can be stored in one byte, six bytes of storage can be used to the six characters "xxxxxx", while only three bytes of storage can be used to store the "6x" representation, cutting the original storage requirement in half.

Many RLE-based different formats for compressing data, such as image data, can be used. Some RLE-based formats, such as the format used by AirPrint™-enabled printing devices, can compress both repeated lines of data using repeated line values and repeated characters, bytes, and/or pixels of data using RLE. Other example formats, such as a Split Run-Length Encoding (SRLE) format, can encode runs of matching and nearly matching data. A conversion technique can be used to translate between the two example formats, or perhaps other (related) compression format(s).

One conversion technique to convert data between RLE formats involves decompress data encoded in an input RLE format to raw (uncompressed) data and then re-compress the raw data to a differing output RLE format. Another technique involves determining specific conversions between encoded values in the input RLE format to encoded values in the output RLE format. The second technique can save space and perhaps time by not explicitly decompressing the encoded data. A third, hybrid technique can involve generally performing conversions between encoded values in the RLE format to encoded values in the output RLE format, while decompressing some of the input data and operating on the decompressed input data. For example, if the input involves indication that a particular line of data has been repeated N times, the line of data can be decompressed, duplicated N times, and the N-times-duplicated and decompressed data can then be converted to the output format.

The conversion techniques disclosed herein can increase the performance of tasks often involve the use of compressed data, such as the printing or other processing of compressed image data. For example, compressed data frequently takes less space for storage and less bandwidth for transmission. Additionally, after data has been converted from an input format to the output format, hardware optimized for the output format can be employed for printing or other processing. Then, a device with the optimized hardware, such as a printing device, can be more flexible by supporting both the input format (via conversion to the output format) and the output format. Additionally, similar conversion techniques can be used for similar input RLE data, and further increase the flexibility of the printing device.

II. Printing System Examples

FIG. 1 is a diagram illustrating printing network 100, according to an example embodiment. Printing network 100 includes printing devices (PDs) 110, 112, 114, one or more client computing devices 116, one or more controlling computing devices 120, one or more cloud servers 130, and one or more print servers 132 interconnected using network 140. In some examples, printing network 100 can have more, fewer, and/or different types of computing devices, servers, and/or printing devices than indicated in FIG. 1.

Printing devices 110, 112, 114 can include devices configured to scan, print, copy, e-mail, account for, communicate and/or otherwise process documents and/or files that are originally available either on paper or electronically. After processing by one or more of printing devices 110, 112, 114, the documents and/or files can be subsequently available either on paper or electronically, as requested. That is, printing devices 110, 112, 114 can process a paper document PD or electronic document ED by at least: creating an electronic document ED1 representing the contents of PD (e.g., scan PD to create ED1), making one or more paper copies of PD, printing one or more copies of ED and/or ED1 on one or more types of paper, make one or more electronic copies of ED and/or ED1, change a format of ED and/or ED1 (e.g., perform OCR scanning, convert a file format used to store ED and/or ED1), maintain remotely-accessible storage (e.g., a document box) enabling other devices than printing devices 110, 112, 114 to use/access ED and/or ED1, and/or communicate the contents of ED and/or ED1 to/from another device.

A document box can be storage allocated to an entity (e.g., a user, an administrator, a company, another type of entity) on a printing device, print server, or another device so the entity can keep and maintain documents, files, and/or other data. In some embodiments, the document box can be accompanied by and/or include storage for personal data, such as address book and/or device accounting storage. The document box, address book, and device accounting storage can store one or more documents, files, personal data, and/or other data, such as contacts, usage and usage limits.

In some embodiments, printing devices 110, 112, 114 can perform other tasks and/or other processing as well. Printing devices 110, 112, 114 can include products from various manufacturers with variations in color, speed, computing power, functionality, network connectivity, and/or other features.

In an example embodiment, some or all printing devices 110, 112, 114 can be connected to network 140 through one or more, possibly different, network protocols. Data can be transmitted between printing devices 110, 112, 114, client computing device(s) 116, controlling computing device(s) 120, cloud server(s) 130, and print server(s) 132 over wired and/or wireless links between computing devices, printing devices, servers and network 140. The format of each respective data transmission between devices in printing network 100 can include one or more of a variety of different formats including: text formats, image formats, extensible mark-up language (XML), database tables, a flat file format, or another format.

Communications between the computing devices, servers, and printing devices can include: client computing device(s) 116, controlling computing device(s) 120, cloud server(s) 130, and/or print server(s) 132 sending data for print jobs and/or print job portions for printing to printing devices 110, 112, 114 and printing devices 110, 112, 114 sending alert, status, error, and/or other messages to client computing device(s) 116, controlling computing device(s) 120, cloud server(s) 130, and/or print server(s) 132 to inform other devices about error or other conditions of the printing devices; e.g., idle, printing, sleeping, paper jam, low or out of paper, low or out of toner/ink, etc. Other communications between one or more client computing devices, one or more controlling computing devices, one or more servers, and one or more printing devices are possible as well.

Controlling computing device(s) 120 can execute device management software, such as management tools, to perform device management functions for managing printing devices, such as printing devices 110, 112, 114. For example, controlling computing device(s) 120 can create, obtain, update, display, and/or delete data (and perhaps related software) for configurations of printing network 100. Example data for configurations of printing network 100, includes, but is not limited to: data for configuring devices in printing network 100; e.g., data for printing devices 110, 112, 114, data for configuring network protocols (e.g., FTP, HTTP, JMS, KPDL, PCT, PDF, SOAP, SMS, SMTP, SNMP, TCP/IP, UDP, LDAP, MQ, and/or other protocols), access-management related data for clients and/or servers; (e.g., passwords, signatures, credentials, certificates, subscriptions, licenses, and/or tokens related to accessing part or all of the functionality of network 140 and/or cloud-based services, software and/or solutions) and data for customizing, configuring and managing applications on devices/servers of printing network 100.

One or more cloud servers 130 can be configured to process jobs related to devices connected to network 140 and/or other networks; e.g., remotely accessible devices via a private network such as a VPN and/or LAN not directly connected to network 140, Internet-accessible devices that may or may not have access to network 140. In some embodiments, cloud server(s) 130 can provide some or all of the functionality for one or more document solutions and managed print services; e.g., functionality for accounting and maintenance of solutions and services, functionality for document workflows, such as processing forms, hard-copy signatures, client authentication/access functions, user interface functionality, local and/or remote network based storage management involving devices in printing network 100.

One or more print servers 132 can be configured to process jobs (e.g., spool job-related data, route jobs, provide user and/or server-related accounting for jobs, verify/enforce authentication and authorization rules related to jobs) and store data related to printing devices of network 140 as part of performing the herein-described functionality of a print server. The jobs processed by cloud server(s) 130 and print server(s) 132 can include, but are not limited to, print jobs/printing requests, communicating documents, files, and/or related data (e.g., data in e-mails, SMS messages, etc.), document and file-related requests (e.g., creating, formatting, scanning, reformatting, converting, accessing, updating and/or deleting one or more documents and files), jobs for document workflow, and/or processing information about errors/complaints about the printing device (e.g., creating, reviewing, updating, assigning, reassigning, communicating, and/or deleting trouble tickets related to errors/complaints about printing (and perhaps other) devices 110, 112, 114. The data can include data used in processing jobs (e.g., spooled data for print jobs, files for file-related requests, etc.), access-management related data, primary identification characteristics and/or model-dependent information about printing devices served by cloud server(s) 130 and/or print server(s) 132, and perhaps other data.

Figure 2:
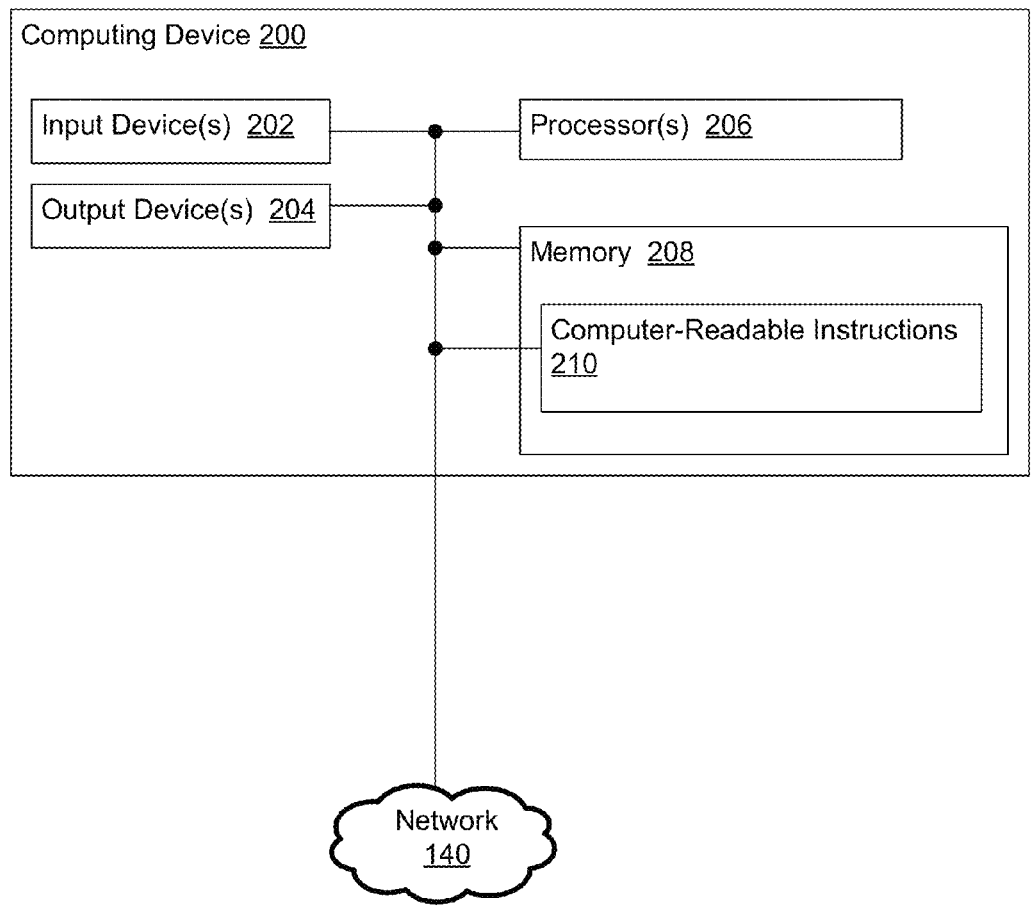
FIG. 2 is a schematic block diagram illustrating a computing device, according to an example embodiment.

FIG. 2 is a schematic block diagram illustrating computing device 200, according to an example embodiment. In some embodiments, computing device 200 can be configured to perform one or more herein-described functions of: printing network 100, printing devices 110, 112, 114, client computing device 116, controlling computing device 120, cloud server(s) 130, print server(s) 132, processors 302, 308, converter 304, bus 306, methods 450, 500, and 600, as well as part, the entire herein-described functionality related to scenario 400, and/or the entire herein-described functionality disclosed in the Appendix.

Computing device 200 can include one or more input devices 202, one or more output devices 204, one or more processors 206 and memory 208. Input devices 202 can include user input devices, network input devices, sensors, and/or other types of input devices. For example, input devices 202 can include user input devices such as a touch screen, a keyboard, a keypad, a computer mouse, a track ball, a joystick, a camera, a voice recognition module, and/or other similar devices. Network input devices can include wired network receivers and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, such as wired portions of network 140, and/or wireless network receivers and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network, such as wireless portions of network 140. Sensors can include devices configured to measure conditions in an environment of computing device 200 and provide data about that environment, such data including, but not limited to, location data, velocity (speed, direction) data, acceleration data, and other data about the environment for computing device 200. Example sensors include, but are not limited to, GPS sensor(s), location sensors(s), gyroscope(s), accelerometer(s), magnetometer(s), camera(s), light sensor(s), infrared sensor(s), and microphone(s). Other input devices 202 are possible as well.

Output devices 204 can include user display devices, audible output devices, network output devices, and/or other types of output devices. User display devices can include one or more printing components, liquid crystal displays (LCD), light emitting diodes (LEDs), lasers, displays using digital light processing (DLP) technology, cathode ray tubes (CRT), light bulbs, and/or other similar devices. Audible output devices can include a speaker, speaker jack, audio output port, audio output device, headphones, earphones, and/or other similar devices. Network output devices can include wired network transmitters and/or transceivers, such as an Ethernet transceiver, a Universal Serial Bus (USB) transceiver, or similar transceiver configurable to communicate via a twisted pair wire, a coaxial cable, a fiber-optic link, or a similar physical connection to a wireline network, such as wired portions of network 140, and/or wireless network transmitters and/or transceivers, such as a Bluetooth transceiver, a Zigbee transceiver, a Wi-Fi transceiver, a WiMAX transceiver, a wireless wide-area network (WWAN) transceiver and/or other similar types of wireless transceivers configurable to communicate via a wireless network, such as wireless portions of network 140. Other types of output devices can include, but are not limited to, vibration devices, haptic feedback devices, and non-visible light emission devices; e.g., devices that emit infra-red or ultra-violet light. Other output devices 204 are possible as well.

Processors 206 can include one or more general purpose processors, central processing units (CPUs), CPU cores, and/or one or more special purpose processors (e.g., graphics processing units (GPUs), digital signal processors (DSPs), field programmable gated arrays (FPGAs), application specific integrated circuits (ASICs), etc.). Processors 206 can be configured to execute computer-readable program instructions 210 that are contained in memory 208 and/or other instructions as described herein. In some embodiments, processor 206 can be configured to perform part or the entire herein-described functionality of processors 302 and/or 308.

Memory 208 can include non-transitory machine-readable storage configured to store data and/or instructions. In particular, memory 208 can store machine-readable instructions 210 that, when executed by processor(s) 206, can cause a computing device to perform functions, such as but not limited to, functions of herein-described devices, networks, methods, features, and scenarios. In some embodiments, machine-readable instructions 210 can include instructions that, when executed, can perform part or the entire herein-described functionality of printing device 110 and/or converter 304.

Figure 3:
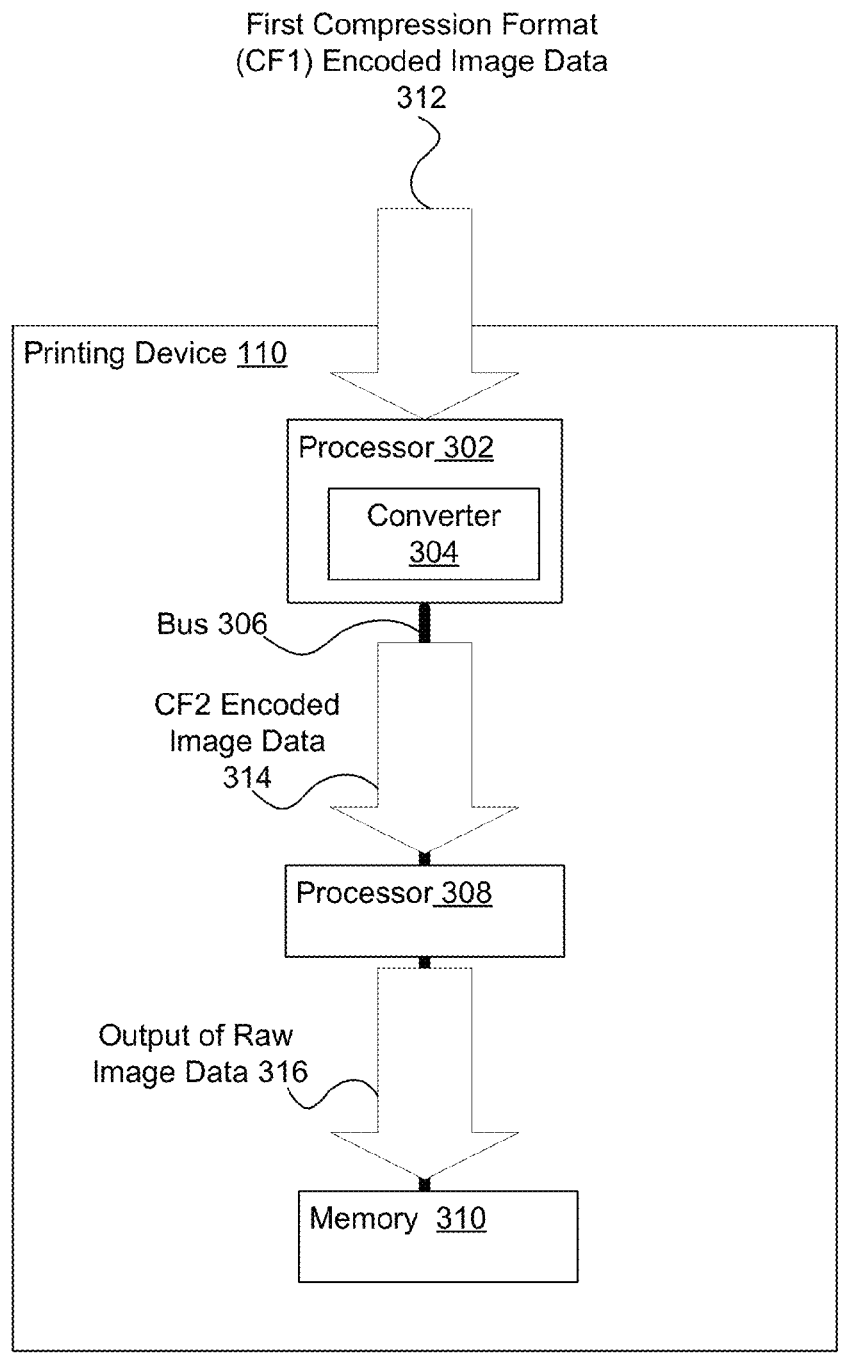
FIG. 3 is a schematic block diagram illustrating aspects of a printing device, according to an example embodiment.

FIG. 3 is a schematic block diagram illustrating aspects of printing device 110, according to an example embodiment. As illustrated, these aspects include processor 302 configured with hardware and/or software for carrying out the herein-described functionality of converter 304, as well as bus 306 and processor 308. In operation, printing device 110 can receive image data 312 encoded in a first compression format CF1). Converter 304 executing using processor 302 can then convert image data 312 into image data 314 encoded in second compression format (CF2). While the first and second compression formats can differ, the underlying uncompressed data can remain the same; i.e., the conversion from CF1 encoded image data 312 to CF2 encoded image data 314 can be lossless. After converting CF1 encoded image data 312 to CF2 encoded image data 314, processor 302 and/or converter 304 can put CF2 encoded image data 314 on bus 306 to be received by processor 308. Processor 308 can include hardware and/or software to decompress CF2 encoded image data 314 into raw format, and provide the raw image data as output 316. In some cases, processor 302 can include specialized hardware; e.g., ASIC(s), GPU(s), etc., to perform conversion between the CF1 format and the CF2 format. In other cases, processor 308 can include specialized hardware; e.g., ASIC(s), GPU(s), etc., to decode CF2 encoded image data 314 for generating output 316.

After generation, output 316 can be stored in memory 310. In some cases, output 316 can be further processed (e.g., recompressed, processed by a video or other processing unit) before being stored in memory 310. Once stored, output 316 can be retrieved from memory 310 for printing on paper (or another medium) via a printer engine of printing device 110 (printer engine not shown in FIG. 3), transmission to another device, displayed on a display device, written to a file, and/or otherwise processed by printing device 110.

IV. RLE Format Conversion Scenario

FIGS. 4A-4H illustrate scenario 400 for converting image data compressed using an input run-length encoded format to the same image data compressed using an output run-length encoded format, according to an example embodiment. Scenario 400 involves examples of using herein-described printing device 110, especially converter 304, to convert an input color matrix formatted (encoded) using compression format CF1 to a corresponding output formatted using compression format CF2, where both formats CF1 and CF2 are RLE formats. Data encoded in either the first compression format CF1 or in the second compression format CF2 can be encoded as a series of lines; e.g., a CF1 or CF2 encoding of color matrix 410 can include eight lines of pixels, where each line of pixels has eight pixels. In other scenarios, one or more other devices than printing device 110; e.g., other printing devices, other types of computing devices, can be configured with converter 304 and so can perform some or all of the techniques described in the context of scenario 400.

As disclosed herein and in the Figures, values that begin with the characters "0x" are hexadecimal values; e.g., 0xFF=FF hexadecimal=255 decimal. Unless otherwise stated, CF1- and CF2 encoded values mentioned herein and shown in the figures are hexadecimal values, and all other numerical values not preceded by "0x" are decimal values.

FIG. 4A illustrates color matrix 410, which is an 8×8 matrix of pixels. Each pixel in color matrix 410 has three eight-bit values: a red value, a green value, and a blue value. Each of the respective red, green, and blue values can range from 0 to 255, and represents a separate color plane. In the specific example of color matrix 410, the pixels represent one of five colors: white (W), red (R), green (G), blue (B), and yellow (Y). Table 412, represented herein as Table 1 below, indicates pixel values using hexadecimal values. For example, the first row of Table 412 (or Table 1 below) indicates that a white pixel has a red plane value of 0xFF, a green plane value of 0xFF, and a blue plane hexadecimal value of 0xFF. As another example, the last row of Table 412 (or Table 1) indicates that a yellow pixel has a red plane value of 0xFF, a green plane value of 0xFF, and a blue plane value of 0x00 (0 decimal).

TABLE 1

| Pixel | Color | Red Plane | Green Plane | Blue Plane |
|-------|-------|-----------|-------------|------------|
| W | White | 0xFF | 0xFF | 0xFF |
| R | Red | 0xFF | 0x00 | 0x00 |
| G | Green | 0x00 | 0xFF | 0x00 |
| B | Blue | 0x00 | 0x00 | 0xFF |
| Y | Yellow | 0xFF | 0xFF | 0x00 |

FIG. 4A also shows interleaved color data 420, which replaces the pixel nomenclature (W, R, G, B, Y) of color matrix 410 with the respective hexadecimal (hex) values for the pixels. For example, Pixel 1 in Line 1 of interleaved color data 420 is shown as "FF FF FF" to indicate that the pixel has a red plane hexadecimal value of FF, a green plane hexadecimal value of FF, and a blue plane hexadecimal value of FF. As another example, Pixel 1 in Line 5 of interleaved color data is shown as "FF FF 00" to indicate that the pixel has a red and green plane hexadecimal values of FF, and a blue plane hexadecimal value of 00.

The color data in interleaved color data 420 can be split into color planes, such as respective red, green, and blue color planes. FIG. 4B shows data 422, 424, 426 representing a split of interleaved color data 420 into three color planes: red plane data 422 for the red color plane, green plane data 424 for the green color plane, and blue plane data 426 for the blue color plane.

In scenario 400, both the first compression format CF1 and the second compression format CF2 assume that the input includes one or more lines of data items, such as bytes, pixels, or other items, with each line having the same length. In scenario 400, the input to converter 304 includes one or more representations of color matrix 410; e.g., in some aspects of scenario 400 as indicated below, the input to converter 304 is a CF1 encoded version of interleaved color data 420 which is an 8×8 grid of three-byte pixels. In other aspects of scenario 400 as indicated below, the input to converter 304 is a CF1 encoded version of one or more of red plane data 422, green plane data 424, and blue plane data 426, each of which is an 8×8 grid of bytes. As such, a line length of eight is used throughout scenario 400 for encodings in both the first compression format CF1 and the second compression format CF2.

FIG. 4C shows summary 430 of the first compression format CF1, which can be used to encode an input to converter 304. In scenario 400, the input includes either (i) lines of three-byte pixel data represented as triples [R, G, B], where R is a red plane value, G is a green plane value, B is a blue plane value, and each of R, G, and B is in the range [0x00, 0xFF] or (ii) lines of one-byte pixel data represented as a value in the range [0, 255]=[0x00, 0xFF].

Summary 430 indicates that each CF1 encoded line can use the format:

CC C1 [data1 [C2 [data2 . . . ]]], where:
each of CC, C1, C2 . . . can be a byte (8-bit) value, and
each of data1, data2 . . . can be one or more byte values.

A CC byte can represent a repeat count value in the range [0, 255] indicating how many times a current line was repeated in the original input. For example, if CC equals 0, then a current line was not repeated in the original input—that is, the current line differs from a following line of the original data. As another example, if CC equals 2, then the current line is to be repeated twice, that is, three lines of the original data—the current line and the subsequent two lines—were the same.

As indicated by summary 430, the value of C1 (or subsequent values C2 . . . Cn) represents an operational code, or opcode for short. The opcode, shown in summary 430 as C1, can be a byte having a decimal value in one of the following three ranges:

(1) a first range of [0, 127] (equivalent to 0x00-0x7F) for a "repeat data item operator" indicating that data1 is repeated in the current line C1+1 times. For example, if C1=2 and data1="0xFF 0x00 0x00", then the current line begins with 3 repetitions of "0xFF 0x00 0x00", so the current line as "0xFF 0x00 0x00 0xFF 0x00 0x00 0xFF 0x00 0x00".

(2) a second range of 128 (0x80), for a "white space operator" indicating that white space is repeated to the end of the current line. A white space pixel (or character or byte) can be represented using a predefined value, such as 0x00 or 0xFF—for the remainder of this disclosure, a white space pixel is represented using the predefined value of "0xFF". In some examples, where the CF1 encoded line is encoding three-byte pixel values, a white space value can be "0xFF 0xFF 0xFF"; while in examples where the CF1 encoded line is encoding one-byte color plane values, a white space value can be "0xFF". For example, in scenario 400 where each input line has eight values, a CF1 encoded line of "00 80"

that is encoding one-byte color plane values, the CF1 encoded line indicates that CC=0, so the CF1 encoded line is not repeated, and the value of "80" indicates that the entire CF1 encoded line is white space. That is, the CF1 encoded line of "00 80" corresponds to an input line of "0xFF 0xFF 0xFF 0xFF 0xFF 0xFF 0xFF 0xFF". As another example, if the CF1 encoded line is "00 01 27 80" and an input line has eight single byte values, then the input includes a non-repeated line (first byte of the CF-encoded line=00) having two repetitions of a byte valued as 0x27 (second and third bytes=01 27), and the remaining six bytes being white space (fourth byte=80); that is, the CF1 encoded line represents an input line of "0x27 0x27 0xFF 0xFF 0xFF 0xFF 0xFF 0xFF".

(3) a third range of [129, 255] (0x81-0xFF), for a "non-repeat data item operator" indicating a number of non-repeated pixels determined by the expression (257−C1) decimal (that is, for values of C1=[129, 255], the number of non-repeated pixels is in the range [2, 128]), where the non-repeated pixels that are represented by data1. For example, if the CF1 encoded line includes "FE 12 34 56", then the corresponding portion of the input line has three non-repeated pixels, as 0xFE=254, leading to a corresponding number of non-repeated pixels equal to 257−254=3, where the three non-repeated pixels are "12 34 56". As another example, if the CF1 encoded line is "00 01 22 FE 14 28 17 80" and an input line has eight single byte values, then the input includes a non-repeated line (first byte of the CF-encoded line=00) having two repetitions of a byte valued as 0x22 (second and third bytes=01 22), three non-repeating bytes having values 0x14 0x28 0x17 (fourth through seventh bytes=FE 14 28 17), and the remaining three bytes being white space (eighth byte=80); that is, the CF1 encoded line represents an input line of "0x22 0x22 0x14 0x28 0x17 0xFF 0xFF 0xFF".

As examples, FIG. 4C also depicts CF1 encoded interleaved color data 432, which is a CF1 encoding of interleaved color data 420, CF1 encoded red plane data 434, which is a CF1 encoding of red plane data 422, CF1 encoded green plane data 436, which is a CF1 encoding of green plane data 424, and CF1 encoded blue plane data 438, which is a CF1 encoding of blue plane data 426. During scenario 400, one or more of CF1 encoded interleaved color data 432, CF1 encoded red plane data 434, CF1 encoded green plane data 436, and CF1 encoded blue plane data 438 can be input to converter 304.

FIG. 4D shows summary 440 of the second compression format CF2, which converter 304 can use to generate an output, such as CF2 encoded image data 314. In scenario 400, the output of converter 304 includes one or more representations of color matrix 410; e.g., in some aspects of scenario 400 as indicated below, the output of converter 304 is a CF2 encoded version of interleaved color data 420 which is an 8×8 grid of three-byte pixels. In other aspects of scenario 400 as indicated below, the output of converter 304 is a CF2 encoded version of one or more of red plane data 422, green plane data 424, and blue plane data 426, each of which is an 8×8 grid of bytes. The particular output of converter 304 is a CF2 encoded version of the input to the converter 304; e.g., if the input to converter 304 is a CF1 encoded version of green plane data 424, then the output of converter 304 is a CF2 encoded version of green plane data 424.

FIG. 4D shows summary 440 of the second compression format CF2, which can be used to encode an output to converter 304. In scenario 304, the input, and correspondingly the output, includes either (i) lines of three-byte pixel data represented as triples [R, G, B], where R is a red plane value, G is a green plane value, B is a blue plane value, and each of R, G, and B is in the range [0x00, 0xFF] or (ii) lines of one-byte pixel data represented as a value in the range [0, 255]=[0x00, 0xFF].

Summary 440 indicates that each CF2 encoded operation can have one or more operands and zero or more associated values. A CF2 encoded operation can use the format:

OP1 [|v1 [OP2 [|v2[ . . . . ]]], where OP1, OP2 . . . are opcodes encoded using one or more bits, v1, v2 . . . are values encoded using one or more bits, and "|" represents a logical OR operation.

As examples, the second compression format CF2 can use six opcodes:

L for Literal data,
NS for a "near match single",
NR for a near match repeated,
M for a match,
EOLN for end of line, and
Escape for switching between CF2 modes.

Summary 440 uses the following conventions to describe the second compression format CF2: a variable V represents a current pixel value represented as 8-bit byte, a variable P represents a previous pixel value, a variable RL represents a run length corresponding to number of consecutive pixel values equal to V, and a variable Delta is set to V−P.

In CF2 encodings, a literal operation can encode a one-byte (8-bit) value, which can be a single initial value, a first value of an encoded "match" or run, a single value that deviates beyond a defined range from a previous value in a sequence of values in a data stream, and perhaps another type of value. A literal operation can use the following 10-bit format:

L (2 bits)|V (8 bits), where L=0x200.

As an example, if V=0x23, a corresponding CF2 encoding of a literal with a value of 0x223 can be output, perhaps as the following 10-bit binary value: 1000100011.

In CF2 encodings, a near match operation can encode values that deviate within a predetermined range from a previous value in the sequence of the data stream; that is, the variable Delta is within the predetermined range. In scenario 400, the predetermined range can be [−16, 15] or [−0x10, 0xF], but not including 0. In some embodiments, such as those used in scenario 400, two different near match opcodes can be used: opcode NS for a near match single operation, and opcode NR for a near match repeat operation.

A near match single operation can use a 6-bit encoding to encode two values that are within the predetermined range. The 6-bit encoding for a near match single operation can use the following format:

NS (1 bit)|Delta (5 bits), where NS=0x00.

For example, suppose the following three values are to be CF2 encoded as bytes: 0x40 0x43 0x88. Then, the first of these three bytes, 0x40, can be encoded as a literal value, the second byte, 0x43 can be encoded using a near match single operation as Delta=0x43-0x40=0x03 is within the range [−0x10, 0xF], and the third byte, 0x88, can be encoded using a literal operation: as Delta=0x88−0x43=0x45, which is outside the [−0x10, 0xF] range. Then, the example three values can be represented by three CF2 operations as follows:

1. Literal 0x43 (10 bits)=0x200|0x43=0x243= 1001000011 (binary)

2. Near Match Single, Delta 0x03 (6 bits)=0x00|0x03=0x03 (6 bits)=000011 (binary)
3. Literal 0x88=0x200|0x88 (10 bits)=0x288=1010001000 (binary)

The resulting binary values can be concatenated into a 26-bit bit string: 10010000110000111010001000. In scenario 400, processor 302 addresses memory using 32-bit words; therefore, converter 304 operates on data stored in 32-bit words. Thus, CF2 output of converter 304 can be right padded with zeroes to fit a 32-bit word. In this example, the 26-bit bit string can have six zeroes appended or padded, leading to the following 32-bit bit string: 10010000110000111010001000000000. Then, the 32-bit bit string can be broken into four-bit fields to be written in hexadecimal as follows: 1001 (0x9) 0000 (0x0) 1100 (0xC) 0011 (0x3) 1010 (0xA) 0010 (0x2) 0000 (0x0) 0000 (0x0)=0x90C3A200. In other scenarios, CF2 output can be provided without padding.

In scenario 400, processor 302 and, therefore converter 304, represent data using byte-addressable little-endian sequencing. Typically, words of binary data can be represented and stored by a processor in memory using one of two sequencing schemes: a big-endian scheme or a little-endian scheme. A big-endian scheme involves storing most-significant byte (that is, the eight bits of the word having the greatest numerical values) of a word at the smallest (byte-addressable) address of the word, and the least significant byte (that is, the eight bits of the word having the smallest numerical values) at the largest (byte-addressable) address of the word. Conversely, a little-endian scheme involves storing the least significant byte at the smallest (byte-addressable) address of the word and the most significant at the largest (byte-addressable) address of the word. So, during scenario 400, processor 302 and/or converter 304 can convert from the little-endian sequence to the big-endian sequencing by byte swapping, so that an example four bytes 1, 2, 3, 4 stored in a 32-bit word in a little-endian sequence by processor 302 are reordered as 4, 3, 2, 1 as needed for big-endian sequencing. Then, if converter 304 and/or processor 302 is directed to convert the bit string 0x90C3A200 generated in little-endian sequence for the above-mentioned CF2 encoding of "0x40 0x43 0x88", the resulting big-endian sequenced big-endian bit string would be 0x00A2C390.

In some scenarios, input to converter 304 can be padded to fit a predefined word size, such as a 32-bit word, and/or can be converted between big-endian and little-endian sequencing. Continuing the above example, the input of "0x40 0x43 0x88" can be padded to fit a 32-bit word, leading to padded input of "0x40 0x43 0x88 0x00", and perhaps converted between big-endian and little-endian sequencing to yield a re-sequenced padded input of "0x00 0x88 0x43 0x40".

A CF2 near match repeat operation can encode three or more identical values that are within the predetermined range by including run length data to indicate the number of consecutive identical values. For example, if the input data were 0x40 0x43 0x43 0x43 0x88, then the first value "0x40" can be encoded as literal 0x40, the values "0x43 0x43 0x43" can be encoded as a near match repeat of length three, and the last value "0x88" can be encoded as another literal value.

FIG. 4D shows that a 9-bit near match repeat operation can use the following format:

NR (2 bits)|(RL−1)*32 (2 bits)|Delta (5 bits),
where NR=0x180,
RL in the range [1, 3], and
Delta is a value in the predetermined range of [−16, 15] or [−0x10, 0xF], but not including 0.

To continue the above example, suppose that input data of 0x40 0x43 0x43 0x43 0x88 is provided for CF2 encoding. Then, this input data can be encoded into the following three CF2 operations:
1. Literal 0x43 (10 bits)=0x200|0x43=0x243=1001000011 (binary)
2. Near Match Repeat, RL 0x03, Delta 0x03 (9 bits)=0x180|0x03*32|0x03=0x180|0x60|0x03=0x1E3=111100011 (binary)
3. Literal 0x88=0x200|0x88 (10 bits)=0x288=1010001000 (binary)

The resulting binary values can be concatenated into a 29-bit bit string: 10010000111111000111010001000 and padded to make a corresponding 32-bit padded bit string 1001 0000 1111 1100 0111 0100 0100 0000=0x90FC7440. In scenario 400, the bit string 0x90FC7440 is stored using little-endian sequencing, and this little-endian sequenced bit string and/or a corresponding big-endian sequenced bit string 0x4074FC90 can be output as the CF2 encoding of this example.

In some embodiments, the near match single opcode is not used and a near match repeat operation can also encode a run length of one. In other embodiments, the near match repeat operation can use additional; e.g., ten bits, to encode a value of RL, the run length.

A CF2 match operation can encode values that are identical to the values that precede them in the sequence of the data stream. That is, when if V=P and so RL>0, the values following an initial occurrence of P (which can be encoded using a Literal operation) are the same and a Match operation can be used to encode the following values. In some embodiments, such as shown in FIG. 4D, multiple match opcodes can be used; for example, a Short Match opcode can be used as part of an operation encoding a relatively-short run of identical values, while a Long Match opcode can be used as part of an operation encoding a relatively-long run of identical values.

Summary 440 indicates that a match operation includes a run length field in order to indicate the number of consecutive identical values that occur in the data stream. The run length field size may be altered to handle longer or shorter runs; e.g., the Short Match operation can use a two-bit run length field to encode runs of lengths 1-3 and the Long Match operation uses a 10-bit run length to encode runs with lengths up to 1027. Specifically, a 6-bit short match operation can encode a run of length one to three using the following format:

SMOP (4 bits)|RL−1 (2 bits),
where SMOP=the short match opcode=0x3C.
As RL−1 is encoded using two bits, RL−1 for a short match is in the range [0, 2], thus RL is the range [1, 3].

A long match operation can encode a run of length between four and 1027 using the following 16-bit format:

LMOP|RL−4 (10 bits),
where LMOP=the long match opcode=0xFC00.
As RL−4 is encoded for a long match using 10 bits, RL−4 is in the range [0, 1023], and thus RL for a long match is in the range [4, 1027].

As an example, suppose the following eight hexadecimal values are provided for CF2 encoding: 20 20 50 50 50 50 50 50; that is, a run of two 0x20 values followed by a run of six 0x50 values. This input can be encoded using four CF2 operations as follows:
1. Literal 0x20 (10 bits)=0x200|0x20=0x220=1000100000 (binary)
2. Short Match, RL=2 (6 bits)=0x3C|(2−1)=0x3D=111101 (binary)

3. Literal 0x50 (10 bits)=0x200|0x50=0x250=10 0101 0000 (binary)
4. Long Match, RL=6 (16 bits)=0xFC00|(RL−4)= 0xFC00|0x0002=1111110000000010 (binary)

The resulting binary values can be concatenated into a 42-bit bit string: 100010000011110110010100001111110000000010. The 42-bit concatenated bit string can be padded to make a corresponding 64-bit padded bit string 1000 1000 0011 1101 1001 0100 0011 1111 0000 0000 1000 0000 0000 0000 0000 0000, whose hexadecimal representation is 0x883D943F00800000. In scenario 400, the bit string 0x883D943F00800000 is stored using little-endian sequencing of 32-bit words, and this little-endian sequenced bit string and/or a corresponding big-endian sequenced bit string 0x3F943D8800008000 can be output for this example.

As indicated in summary 440 of FIG. 4D, an EOLN, or end of line opcode, can have a value of 0x00 and be stored in 8 bits. An EOLN operation does not encode a specific value; rather, the EOLN operation only includes an end of line opcode. The end of line opcode can signal the end of a line. In some embodiments, a pair of end of line opcodes; e.g., a value of 0x0000, can be used as an end of file code to signal the end of a file, data stream, or other data source encoded using CF2 encoding.

In scenario 400, an escape operation comprising an escape opcode can be used. For example, the escape opcode can be stored in eight bits and have a value of 0x03. The escape opcode can enable switching between modes, such as a mode A suitable for high resolution original image data and mode B suitable for lossy filtered data. Mode A can utilize the above-mentioned CF2 encoding to encode CF2 operations, including Literal, Near Match Single, Near Match Repeat, Match, and End of Line operations. Mode B can be used with certain data, such as data known and/or filtered to contain many long runs of identical values. Mode B can encode a full value of a three-byte pixel, byte, or other unit of data along with the run length for the number of identical values that immediately follow it. Switching between modes enables encoding a document according to the type of data or known properties of a document. Switching between the first process and the second process can be done adaptively by an encoder within a scanline, from scanline to scanline or from band to band as needed. In scenario 400, converter 304 starts in and remains using mode A throughout; i.e., no escape codes are processed during scenario 400.

Figure 4E:
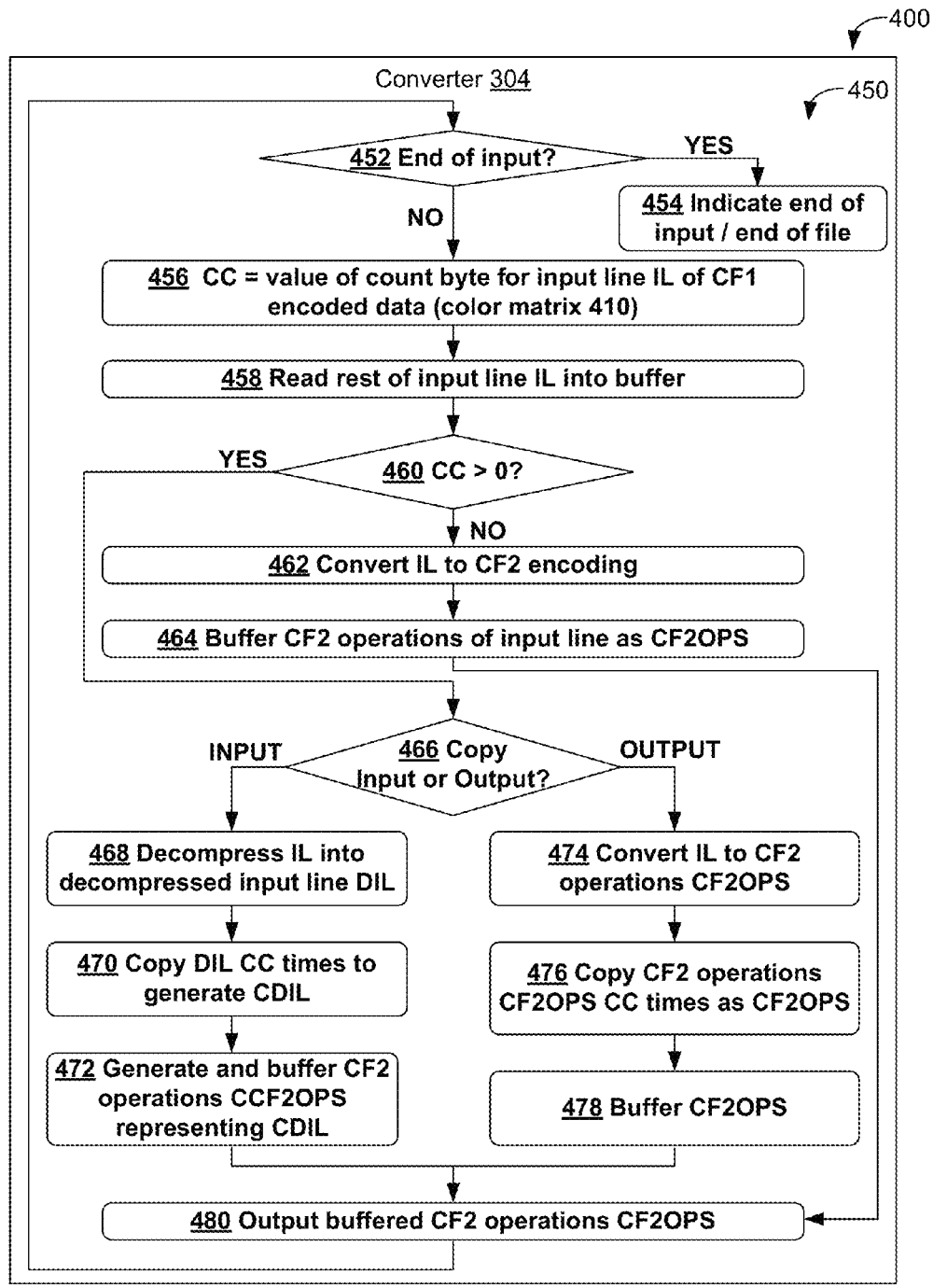

As indicated above, CF2 operations can encode data where data repetitions are determined on a per byte (8 bits) basis. In other embodiments, CF2 operations can encode data on a per pixel (e.g., 24 bits for RGB data, 32 bits for CYMK or RGB-alpha data) or based on another data size;

FIG. 4E shows an example conversion method 450 that can be used by converter 304 during scenario 400 to convert input encoded in first compression format CF1 to output encoded in second compression format CF2.

Method 450 can utilize two parameters—LEN and SZ—about the input encoded in format CF1. The parameter LTH can be set to a length of a line of data encoded in CF1 format. In scenario 400, each input line is a line of image data from one or more color planes of color matrix 410, and so the parameter LTH=8 for scenario 400. If LTH<1, then the line length is 0 or negative, which is erroneous, and so method 450 can be prematurely terminated due to an incorrect LTH value; therefore, the discussion below assumes that LTH≥1.

The parameter SZ can be set to a size in bytes of a data item represented using CF1 format. For example, if the CF1-formatted input encodes pixels of interleaved color data 420, the represented data item can be a pixel, and so SZ=3. As another example, if the CF1-formatted input encodes blue plane data 422, green plane data 424, and/or blue plane data 426, the represented data item can be one byte of color data, and so SZ=1. If SZ<1, then the size of a data item length is 0 or negative, which is erroneous, and so method 450 can be prematurely terminated due to an incorrect SZ value; therefore, SZ is assumed to be greater than or equal to 1.

The second compression format CF2 discussed above in the context of FIG. 4D can readily encode single-byte-sized data items; e.g., a CF2 literal operation encodes an 8-bit/one-byte data item, and so can be used as described above if SZ=1. So, the discussion of method 450 initially assumes SZ=1; embodiments of method 450 where SZ>1 are described after discussion of block 480 below.

Method 450 can begin at block 452, where converter 304 can determine whether an end of CF1 encoded input has been reached. If the end of input has been reached, converter 304 can proceed to block 454; otherwise, converter 304 can proceed to block 456.

At block 454, converter 304 can indicate an end of input and/or end of file. For example, converter 304 can generate a CF2 end of file operation, such as a 0x0000 value discussed above at least in the context of FIG. 4D, append the end of file operation to any previously buffered output, and output the buffered output, perhaps after padding to a 32-bit word boundary and perhaps after performing a little-endian sequence to big-endian sequence conversion discussed above in the context of at least FIG. 4D. In some embodiments, method 450 can be completed after converter 304 carries out the procedures of block 454.

At block 456, converter 304 can set a variable CC equal to a value from a count byte of an input line IL of CF1 encoded data, where input line IL is input from an input source, such as an input file, input stream, or some other input. In scenario 400, input line IL is a line of image data from one or more color planes of color matrix 410, and so the count byte, and therefore CC, can have a value in the range [0, 255]. In other scenarios, input line IL can be a line of data from other data, which may or may not be image data.

At block 458, converter 304 can read in the remainder of input line IL into a buffer; e.g., an input buffer. Note that, in method 450, once data has been read from the buffer storing input line IL, the data is assumed to be processed.

At block 460, converter 304 can determine whether CC is greater than 0. As discussed above at least in the context of summary 430 of FIG. 4C, first compression format CF1 uses the count byte to indicate whether the remainder of a CF1 encoded line is repeated. In scenario 400, a condition that CC equals 0 indicates that input line IL is not repeated, and a condition that CC is greater than 0 indicates that input line IL is repeated CC times. If CC is greater than 0, converter 304 can proceed to block 466; otherwise, converter 304 can proceed to block 462.

At block 462, CC is known to be equal to 0. Converter 304 can convert the remainder of input line IL to a version of input line IL encoded using CF2 encoding. Converter 304 can initialize a line position LP variable equal to 0. While there is unprocessed data in the buffer storing input line IL, converter 304 can execute a loop LOOP1. As part of LOOP1, converter 304 can read a byte CF1OP representing a CF1 opcode from the buffer storing input line IL. As discussed above in the context of FIG. 4C, CF1OP can either be: (a) in the range [0, 0x7F], which corresponds to a CF1 repeat data item opcode (b) equal to 0x80, which corresponds to a CF1 white space opcode, or (c) in the range [0x81, 0xFF], which corresponds to a CF1 non-repeat data item opcode.

If CF1OP is in the range [0, 0x7F], representing a CF1 repeat data item opcode, then converter 304 can: read another byte RB from the buffer storing input line IL, determine NRP, a number of repeated pixels, as NRP=CF1OP+1, and update the line position variable LP=LP+NRP. If NRP is less than or equal to 4, then converter 304 can generate the following two CF2 operations to represent the repeated data item:

1. Literal Opcode|RB (10 bits)=0x200|RB
 2. Short Match Opcode|NRP-1 (6 bits)=0x3c|NRP-1, where NRP-1 is represented using 2 bits.

If NRP is between 4 and 6, then converter 304 can generate the following three CF2 operations to represent the repeated data item:

1. Literal Opcode|RB (10 bits)=0x200|RB
 2. Short Match Opcode|0x2=0x3E (6 bits), representing a run of length 3.
 3. Short Match Opcode|NRP-4 (6 bits)=0x3c|NRP-4, where NRP-4 is represented using 2 bits.

If NRP is greater than 6, then converter 304 can generate the following two CF2 operations to represent the repeated data item:

1. Literal Opcode|RB, which is a 10 bit value equal to 0x200|RB
 2. Long Match Opcode|NRP-4 (16 bits)=0xFC00|NRP-4,
 where NRP-4 is represented using 10 bits.

If NRP>1027, the number of repeat pixels can be broken into 1027 byte segments as this is the longest match encoded by CF2.

If CF1OP is equal to 0x80, corresponding to a CF1 white space opcode, then the current line is to be filled with LEN-LP white space (0xFF) values. Then, if LEN-LP>0, converter 304 can use the techniques discussed immediately above for the repeat data item operator with NRP=LEN-LP and RB=0xFF to generate the white space values to fill the line. Note that if LEN-LP≤0, the current line position LP is at or past the length of the line, and so no white space filling is to be performed; i.e., the white space operator can be ignored.

If CF1OP is in the range [0x81, 0xFF], representing a CF1 non-repeat data item operator, then converter 304 can determine NNP, a number of non-repeated pixels, as NNP=257-CF1OP, and update the line position variable LP=LP+NNP. Converter 304 can then read NNP bytes from the input buffer. Then, converter 304 can generate a CF2 literal operation for the first byte PB of the NNP bytes as follows:

Literal Opcode|PB (10 bits)=0x200|PB, with PB represented using 8 bits.

Then, for each of the rest of the NNP bytes, converter 304 can iterate through a loop LOOP2. In loop LOOP2, let CB=the current byte. Converter 304 can then determine DIFF=CB-PB. If DIFF=0, then repeating bytes have been found, indicating a possible error in the CF1 encoding of a non-repeat data item.

If DIFF is in the range [-16, 15], but not including 0, then converter 304 can generate the following CF2 operation:
 Near Match Single Opcode|DIFF (6 bits)=0x00|DIFF, with DIFF represented using 5 bits.

Otherwise, DIFF is outside the range [-16, 15], so converter 304 can generate the following CF2 operation:
 Literal Opcode|CB (10 bits)=0x200|CB, with CB represented using 8 bits.

After processing current byte CB, converter 304 can set PB=CB, and start another iteration of loop LOOP2 to process the next of the NNP bytes.

After processing CF1 opcode CF1OP, converter 304 can attempt to perform another iteration of loop LOOP1 to continue processing the CF1 encoded input line. Once the end of the input line is reached, converter 304 can generate the following CF2 operation:
 EOLN opcode=0x00.

If the end of the input has been reached, converter 304 can generate the following CF2 operation:
 End of file opcode=0x0000.

In some embodiments, each CF1 operation read from input line IL can be used to generate an uncompressed data representation, and then converted from the uncompressed data representation to second compression format CF2. In the uncompressed representation, the data can be padded and/or converted between little endian and big endian sequencing. For example, if the CF1 opcode. For example, if CFIOP=0x02 and RB="20", then a corresponding uncompressed data representation can be "20 20 20". If the uncompressed data representation is padded to fit a 32-bit word, then the example uncompressed data representation can be "20 20 20 00". Further, if the padded uncompressed data representation is converted from little endian to big endian sequencing (or vice versa), the example uncompressed data representation can be "00 20 20 20".

At block 464, converter 304 can buffer CF2 output as CF2OPS representing the conversion of encoded input line IL. In scenario 450, buffering CF2 output can include: storing any CF2 operations representing of input line IL generated at block 462 into a buffer, padding data stored in the buffer to a word boundary; such as zeroes appended to complete 32-bit words by processor 302 and converter 304 as discussed above at least regarding FIG. 4D, and/or performing a big-endian/little-endian sequence conversions as discussed above at least with regards to FIG. 4D. For example, CF2 opcodes generated at block 462 can be buffered into 32-bit words of memory. Each preceding output value can be shifted up in an output buffer by a number of bits used to encode a subsequent (incoming) CF2 opcode. When a 32-bit word of the output buffer is filled, the filled word can be emitted to the output buffer. More, fewer, and/or different procedures can be used to buffer output as well. In some embodiments, the procedures of blocks 462 and 464 can be combined.

After completing the procedures of block 464, converter 304 can proceed to block 480.

At block 466, converter 304 can assume that the value of count byte CC is greater than zero, and thus the procedures of blocks 466-478 can assume that input line IL buffered at block 462 is to be repeated CC times. Then, at block 466, converter 304 can determine whether conversion to CF2 format includes either (a) copying the decompressed input CC times or (b) copying the CF2 conversion of input line IL CC times. If the conversion to second compression format CF2 includes copying the decompressed input CC times, then converter 304 can proceed to block 468. Otherwise, the conversion to second compression format CF2 includes copying the CF2 conversion of input line IL CC times, and so converter 304 can proceed to block 474.

At block 468, converter 304 can decompress input line IL into a decompressed input line DIL. For example, while there is unprocessed data in the buffer storing input line IL, converter 304 can execute a loop LOOP1a. As part of LOOP1a, converter 304 can read a byte CF1OPa representing a CF1 opcode from the buffer storing input line IL. As discussed above in the context of FIG. 4C, CF1OPa can either be: (a) in the range [0, 0x7F], which corresponds to a CF1 repeat data item opcode (b) equal to 0x80, which corresponds to a CF1 white space opcode, or (c) in the range [0x81, 0xFF], which corresponds to a CF1 non-repeat data item opcode.

If CF1OPa is in the range [0, 0x7F], representing a CF1 repeat data item opcode, then converter 304 can: read another byte RB from the buffer storing input line IL, determine NRP, a number of repeated pixels, as NRP=CF1OP+1, and update the line position variable LP=LP+NRP. Then, converter 304 can generate NRP copies of byte RB and store the copies of byte RB in memory; e.g., in a buffer storing decompressed input line DIL.

If CF1OPa is equal to 0x80, corresponding to a CF1 white space opcode, then the current line is to be filled with LEN−LP white space (0xFF) values. Then, if LEN−LP>0, converter 304 can use the techniques discussed immediately for the repeat data item operator with NRP=LEN−LP and RB=0xFF to generate the white space values to fill the line.

If CF1OPa is in the range [0x81, 0xFF], representing a CF1 non-repeat data item operator, then converter 304 can determine NNP, a number of non-repeated pixels, as NNP=257−CF1OPa, and update the line position variable LP=LP+NNP. Converter 304 can then read NNP bytes from the input buffer and store the read-in NNP bytes in memory; e.g., in the buffer storing decompressed input line DIL.

After processing CF1 opcode CF1OPa, converter 304 can attempt to perform another iteration of loop LOOP1a to continue processing the CF1 encoded input line.

At block 470, converter 304 can copy decompressed input line DIL CC times to generate copied decompressed input line CDIL. For example, if DIL="12 34 56", and CC=2, then CDIL="12 34 56 12 34 56 12 34 56", which represents an original copy of DIL and two additional copies generated as CC=2. To carry out block 470, converter 304 can make CC additional copies of a representation of decompressed input line DIL generated by block 468, such as a buffer storing the decompressed input line DIL. Then, CDIL can be the representation of decompressed input line DIL and the CC additional copies of decompressed input line DIL; e.g., CDIL can be a memory buffer storing (CC+1) copies of decompressed input line DIL.

At block 472, converter 304 can CF2 encode and buffer the copied decompressed input line CDIL to generate a buffered representation CF2OPS of the CF2 operations representing copied decompressed line CDIL. For example, converter 304 can perform the techniques discussed above in the context of CF2 format summary where the input data for the CF2 format is the copied decompressed input line CDIL.

After completing the procedures of block 472, converter 304 can proceed to block 480.

At block 474, converter 304 can convert the input line IL to one or more CF2 operations CF2OPSa, such as by performing the techniques discussed above in the context of block 462. The resulting one or more CF2 operations can be stored in memory; e.g., in a memory buffer storing a bit string representing the one or more CF2 operations or using some other representation.

At block 476, converter 304 can copy one or more CF2 operations CF2OPSa generated at block 474 CC times. The resulting (CC+1) copies of CF2OPSa can be labeled as CF2OPS.

At block 478, converter 304 can buffer the copied CF2 operations CF2OPS. Converter 304 can buffer CF2OPS using some or all of the techniques for buffering CF2 output discussed above in the context of block 464. After completing the procedures of block 478, converter 304 can proceed to block 480.

At block 480, converter 304 can output the buffered CF2 operations CF2OPS. The CF2 encoded output CF2OPS can be output as one or more files, data streams, and/or as other types of output. After completing the procedures of block 480, converter 304 can proceed to block 452.

As mentioned above, the above discussion assumes that SZ, the size of an input data item, equals 1. When SZ>1, converter 304 can use single-byte-sized CF2 encodings by generating SZ different outputs, one for each input byte of an input data item. For a SZ=3 example, suppose the CF1 formatted input encodes three-byte data items representing red, green, and blue (RGB) values for a pixel. Converter 304 can treat the CF1-formatted input as representing by a sequence of three-byte color pixel values, such as R, G, B, R, G, B . . . . Then, converter 304 can use the techniques of method 450 to generate three different CF2 encoded outputs corresponding to the three-byte RGB CF1 encoded input data; CF2 encoded output for red data values of the CF1 formatted input pixels written to a red color plane output buffer, CF2 output for green data values of the CF1 formatted input pixels written to a green color plane output buffer, and CF2 output for blue data values of the CF1 formatted input pixels written to a blue color plane output buffer.

Another technique that uses single-byte-sized CF2 encodings while SZ>1 can involve converter 304 buffering input data items, and so treating the input as a having input lines of size LTH*SZ, similar to buffering repeated input lines in the context of blocks 468, 470, and 472 of method 450. For example, if the CF1 encoded input encodes a run of size R1 of an SZ-byte-sized input; e.g., an input of the form B(1) B(2) . . . B(SZ), then converter 304 can operate on the run as if it were a run of size R1*SZ. For example, suppose the CF1 encoded input included "0x5 0x00 0x80 0x00" to encode a run of six green pixels. Then, converter 304 can treat this input as a string of R1=6 pixels*SZ=3 bytes/pixel=18 bytes. This string, encoded as hexadecimal values, is: "00 80 00 00 80 00 00 80 00 00 80 00 00 80 00 00 80 00". The string can be converted to CF2 format using the techniques described above; in this example, the string will lead to CF2 encodings for: a Literal opcode with V=0x00, 5 encodings of {a Literal opcode with V=0x80, a Literal opcode with V=0x00, a Short Match opcode with RL=2}, a Literal opcode with V=0x80, a Literal opcode with V=0x00, and perhaps a CF2 encoding for an end of line code.

Another technique that uses single-byte-sized CF2 encodings while SZ>1 can involve converter 304 generating a CF2 encoding of one data item and possibly repeating that encoded value, similar to buffering output lines in the context of blocks 474, 476, and 478 of method 450. Using the example above where the CF1 encoded input included "0x5 0x00 0x80 0x00" to encode a run of six green pixels, converter 304 can generate a CF2 encoded output for one green pixel data item of a Literal opcode with V=0x00, a Literal opcode with V=0x80, and a Literal opcode with V=0x00. This CF2 encoded output for one green pixel data item can be buffered by converter 304 and copied six times to encode the run of six green pixels. The six-times copied green pixel item can then output by encoder 304, perhaps with a CF2 encoding for an end of line code.

Alternative embodiments when SZ>1 can involve use of a variation of the above-described CF2 encoding that encodes multi-byte values; e.g., the variation of the CF2 encoding can utilize a Literal opcode that can encode SZ*8 bit data items and Near Match operands can be used if a difference between two SZ-byte-sized input data items is within a predetermined range. Other techniques for processing multi-byte input data items are possible as well.

FIG. 4F shows example conversions 486, 488 performed by converter 304 from first compression format CF1 to second compression format CF2 of an excerpt 410p1 of color matrix 410 utilizing method 450, which was discussed above in the context of FIG. 4E. As shown in FIG. 4F, color matrix excerpt 410p1 includes the first two rows of color matrix 410, where each of the eight pixels of both of the two rows are all white. A corresponding excerpt 432p1 of CF1 encoded interleaved color data 432 indicates the CF1 encoding of color matrix excerpt 410p1 is "01 80"; that is, a row of white space characters that is duplicated once.

Conversion example 486 shows operation of converter 304 from first compression format CF1 to second compression format CF2 utilizing method 450 involving the duplicate input option embodied as blocks 468-472 of method 450. In example 486, converter 304 can first determine that the end of input is not yet been reached at block 452, and proceed to block 456 to read one byte "01" from the example input CF1-encoded line of "01 80" and set CC=1. At block 458, converter 304 can read in the remainder of input line IL, which is "80", into a buffer. At block 460, converter 304 can determine that, since CC=1, CC is greater than 0, and proceed to block 466.

As indicated on line 1 of example 486, the "copy input" option is selected, so at block 466, converter 304 can proceed to block 468. At block 468, converter 304 can decompress input line IL, leading to a decompressed input line DIL of 24 bytes with all bytes equal to 0xFF, as indicated by line 2 of example 486 of FIG. 4F. At block 470, as CC=1, decompressed input line DIL can be copied one time to generate copied decompressed input line CDIL having 48 bytes all equal to 0xFF as indicated at line 3 of example 486. At block 472, converter 304 can convert decompressed input line CDIL into the second compression format CF2. As shown on lines 4-7 of example 486, a CF2 encoding of copied decompressed input line CDIL can include three operations: a literal operation encoding FF expressed in 10 bits as "1011111111", a long match operation indicating 47 matches expressed in 16 bits as "1111110000101011", and an end of line operation expressed in 8 bits as "00000000".

The bit strings of these three operations can be concatenated into a 34-bit bit string "10111111111111110000101011 00000000" as indicated at line 8 of example 486. The 34-bit bit string can represent the CF2 operations CF2OPS of method 450, and can be buffered at block 472 of method. Line 9 of example 486 shows an example buffering of CF2OPS that has been padded with zeroes to fill two 32-bit words: "1011 1111 1111 1111 0000 1010 1100 0000" and "0000 0000 0000 0000 0000 0000 0000 0000". At block 480 of method 450, the two words of CF2OPS can be output by converter 304, either using little endian sequencing as shown at line 10 of example 486 and/or using big endian sequencing as shown at line 11 of example 486. At lines 10 and 11 of example 486, the output words are shown using hexadecimal notation. After completing block 480, converter 304 can return to block 452 of method 450, determine that no more input exists and execute the procedures of block 454 to indicate an end of input, and so complete example 488.

Conversion example 488 shows operation of converter 304 from first compression format CF1 to second compression format CF2 utilizing method 450 involving the duplicate output option embodied as blocks 474-478 of method 450. In example 488, converter 304 can first determine that the end of input is not yet been reached at block 452, and proceed to block 456 to read one byte "01" from the example input CF1-encoded line of "01 80" and set CC=1. At block 458, converter 304 can read in the remainder of input line IL, which is "80", into a buffer. At block 460, converter 304 can determine that, since CC=1, CC is greater than 0, and proceed to block 466.

As indicated on line 1 of example 488, the "copy output" option is selected, so at block 466, converter 304 can proceed to block 474. At block 474, converter 304 can convert input line IL to second compression format CF2 as one or more CF2 operations CF2OPS. As indicated on lines 3-6 of example 488, CF2OPS includes three operations: a literal operation encoding FF expressed in 10 bits as "1011111111", a long match operation indicating 23 matches expressed in 16 bits as "1111110000010011", and an end of line operation expressed in 8 bits as "00000000".

The bit strings of these three operations in CF2OPS can be concatenated into a 34-bit bit string "10111111111111110000010011 00000000" as indicated at line 7 of example 488. Line 8 of example 488 shows an example of CF2OPS after having been padded with zeroes to fill two 32-bit words: "1011 1111 1111 1111 0000 0100 1100 0000" and "0000 0000 0000 0000 0000 0000 0000 0000". At block 476, as CC=1, these two 32-bit words can be copied one time to fill four 32-bit words "1011 1111 1111 1111 0000 0100 1100 0000", "0000 0000 0000 0000 0000 0000 0000 0000", "1011 1111 1111 1111 0000 0100 1100 0000", and "0000 0000 0000 0000 0000 0000 0000 0000" that can represent CF2OPS as shown in FIG. 4F on line 9 of example 488. At block 478, these four 32-bit words of CF2OPS can be buffered.

At block 480 of method 450, the four words of CF2OPS in example 488 can be output by converter 304, either using little endian sequencing as shown at line 10 of example 488, or using big endian sequencing as shown at line 11 of example 488. At lines 10 and 11 of example 488, the output words are shown using hexadecimal notation. After completing block 480, converter 304 can return to block 452 of method 450, determine that no more input exists and execute the procedures of block 454 to indicate an end of input, and so complete example 488.

Figure 4G:
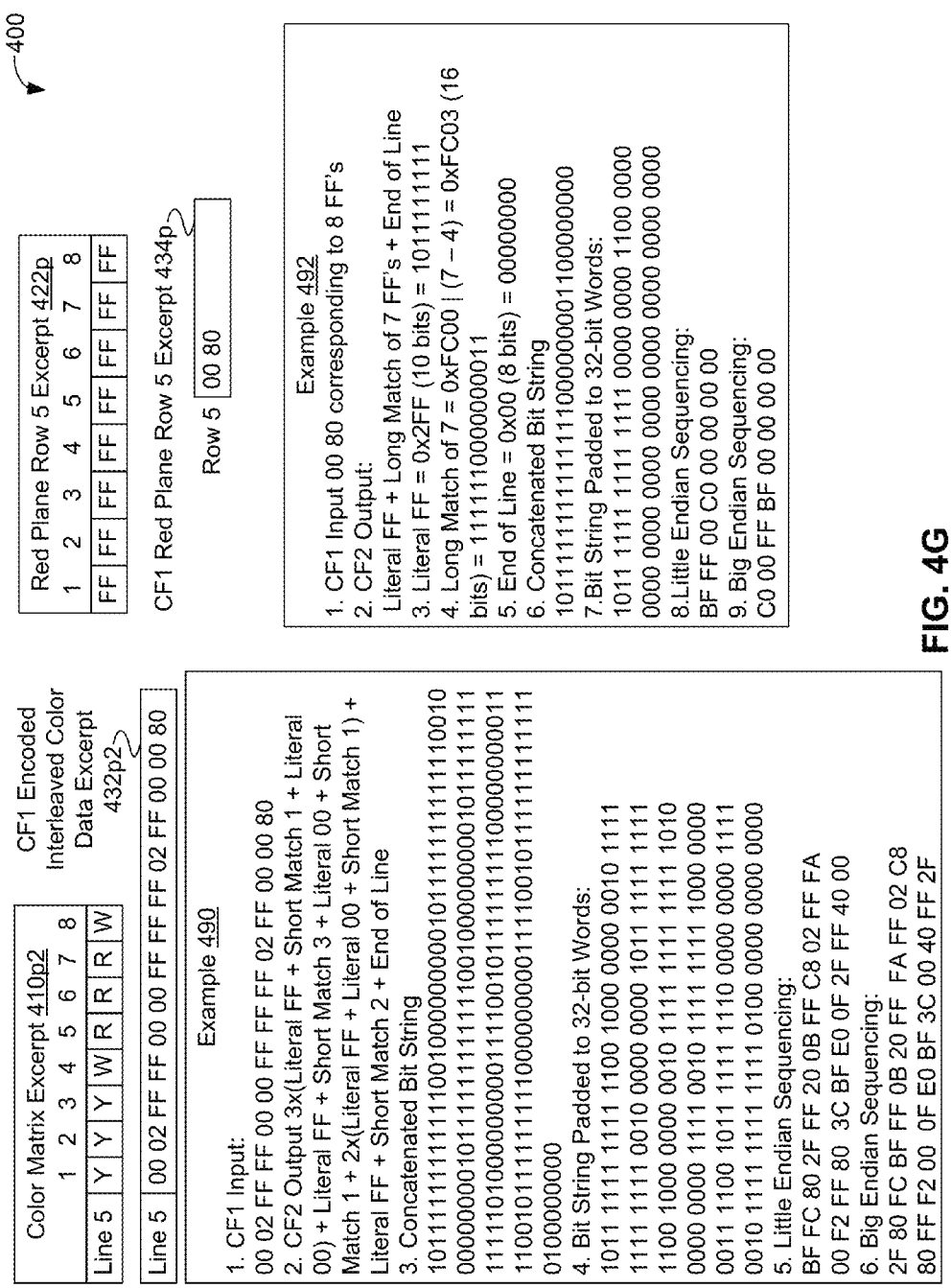

FIGS. 4G and 4H show four conversion examples 490, 492, 494, 496 illustrating operations performed by converter 304 in executing method 450 on excerpts related to line 5 of color matrix 410. Example conversions 490, 492, 494, 496 are performed by converter 304 from first compression format CF1 to second compression format CF2.

In example 490, input to converter 304 is CF1 encoded interleaved color data excerpt 432p2, which is an excerpt encoding data in line 5 of interleaved color data 420, which represents color data in color matrix excerpt 410p2. In example 490, CF1 interleaved color data excerpt 432p2 utilizes three byte pixels as data units, where each three byte pixel includes a first byte representing a red color value/red color plane, a second byte representing a green color value/green color plane, and a third byte representing a blue color value/blue color plane. And in example 490, CF2 encoded output of converter 304 utilizes single bytes as data units.

As shown in FIG. 4G, color matrix excerpt 410p2 includes the fifth row of color matrix 410, which has eight pixels that include (from left to right) three yellow pixels, a white pixel, three red pixels, and a white pixel. A corresponding excerpt 432p2 of CF1 encoded interleaved color data 432 indicates the CF1 encoding of color matrix excerpt 410p2 is "00 02 FF FF 00 00 FF FF FF 02 FF 00 00 80"

which is a non-repeated row, as the first byte is 00 that includes a run of three pixels each having data "FF FF 00" (three yellow pixels according to table 412 of FIG. 4A or Table 1 above), a single pixel having data of "FF FF FF" (a white pixel according to table 412/Table 1), a run of three pixels each having data "FF 00 00" (three red pixels according to table 412/Table 1), and whitespace or pixels having data "FF FF FF" to the end of the line; that is the line ends with one pixel having data "FF FF FF".

Conversion example 490 shows operation of converter 304 from first compression format CF1 to second compression format CF2 utilizing method 450. In example 490, converter 304 can first determine that the end of input is not yet been reached at block 452, and proceed to block 456 to read one byte "00" from the example input CF1-encoded line of "00 02 FF FF 00 00 FF FF FF 02 FF 00 00 80" and set CC=0. At block 458, converter 304 can read in the remainder of input line IL, which is "02 FF FF 00 00 FF FF FF 02 FF 00 00 80" into a buffer. At block 460, converter 304 can determine that, since CC=0, CC is not greater than 0, and proceed to block 462.

At block 462 of method 450, converter 304 can convert the remainder of input line IL to CF2 encoding. Block 462 involves looping through data read from buffered input line IL that represents one or more CF1 operations, each including a CF1 opcode and perhaps affiliated data, and converting the CF1 operation(s) to CF2 operations. In example 490, the CF1 input includes: (a) "02", which is a CF1 repeat data item opcode indicating two repetitions (or a run of three), and associated three-byte data item "FF FF 00", (b) "00", which is a CF1 repeat data item opcode indicating zero repetitions (or a run of one), and associated three-byte data item "FF FF FF", (c) "02", which is a CF1 repeat data item opcode indicating two repetitions (or a run of three), and associated three-byte data item "FF 00 00", and (d) "80", which is a CF1 white space opcode; thus, the loop LOOP1 of block 462 can have four iterations.

During the first of the four iterations of LOOP1, converter 304 can process the CF1 repeat data item opcode indicating a run of three pixels equal to "FF FF 00", converter 304 can treat the run of three "FF FF 00" pixels as a nine-byte run "FF FF 00 FF FF 00 FF FF 00", determine a value for a number of repeated pixels NRP variable equal to 3*3=9, and update a line position variable LP to be 9. Then, processing the nine-byte run leads to emitting: three copies of a CF2 literal operation encoding "FF", a CF2 short match operation with a run length of 1, and a CF2 literal operation encoding "00", shown in FIG. 4G, line 2 of example 490 as "3×(Literal FF+Short Match 1+Literal 00)".

During the second of four LOOP1 iterations, converter 304 can process the CF1 repeat data item opcode indicating one "FF FF FF" pixel as a run of three "FF" bytes and generate a CF2 literal operation encoding "FF" and a CF2 short match operation with a run length of 2. During the third of four LOOP1 iterations, converter 304 can process the CF1 repeat data item opcode indicating three "FF 00 00" pixels as having an initial "FF" byte, leading to a CF2 short match operation with a run length of 1 as the previously emitted literal value encoded an "FF" byte or an update of the previous short match operation to have a run length of 3. FIG. 4G shows the updated short match operation as part of the second line in line 2 of example 490 as "Literal FF+Short Match 3". Then for the remaining eight bytes, converter 304 can generate a CF2 literal operation for a "00" byte, a CF2 short match operation with a run length of 1, a CF2 literal operation for an "FF" byte, a CF2 literal operation for a "00" byte, a CF2 short match operation with a run length of 1, a CF2 literal operation for an "FF" byte, a CF2 literal operation for a "00" byte, and a CF2 short match operation with a run length of 1. These CF2 operations are shown in FIG. 4G in the second and third lines of line 2 of example 490 as "Literal 00+Short Match 1+2×(Literal FF+Literal 00+Short Match 1)".

During the fourth LOOP1 iteration, converter 304 can process the CF1 white space operation by determining that the remainder of line 5 of color matrix 410 is to be filled with LEN−LP=8−7=1 white space pixel value, which is "FF FF FF". Then, converter 304 can treat these three "FF" bytes as a CF1 repeat data item operation with NRP=3 and RB=0xFF and generate a CF2 literal operation for an "FF" byte and a CF2 short match operation with a run length of 2 to generate the white space values to fill the line. These CF2 operations are shown in FIG. 4G in the fourth line of line 2 of example 490 as "Literal FF+Short Match 2". Additionally a CF2 end of line code operation can be generated as CF1 encoded excerpt 432p2 has been completely converted to the second compression format CF2. The CF2 end of line operation is shown in the fourth line of line 2 of example 490 as "End of Line".

Collectively, these CF2 operations are shown for example 490, along with their respective bit encodings in Table 2 below

TABLE 2

| LOOP1 Iteration | CF1 Input (Line 1 of Example 490) | Example 490 Line 2 Output | CF2 Operations | Bit Encodings |
|---|---|---|---|---|
| First, | 02 FF FF 00 | 3×(Literal FF + Short Match 1 + Literal 00) | Literal FF | 1011111111 |
|  |  |  | Short Match 1 | 111100 |
|  |  |  | Literal 00 | 1000000000 |
|  |  |  | Literal FF | 1011111111 |
|  |  |  | Short Match 1 | 111100 |
|  |  |  | Literal 00 | 1000000000 |
|  |  |  | Literal FF | 1011111111 |
|  |  |  | Short Match 1 | 111100 |
|  |  |  | Literal 00 | 1000000000 |
| Second and Third | 00 FF FF FF | Literal FF + Short Match 3 | Literal FF | 1011111111 |
|  |  |  | Short Match 3 | 111110 |
|  | 02 FF 00 00 | Literal 00 + Short Match 1 + 2×(Literal FF + Literal 00 + Short Match 1) | Literal 00 | 1000000000 |
|  |  |  | Short Match 1 | 111100 |
|  |  |  | Literal FF | 1011111111 |
|  |  |  | Literal 00 | 1000000000 |
|  |  |  | Short Match 1 | 111100 |
|  |  |  | Literal FF | 1011111111 |
|  |  |  | Literal 00 | 1000000000 |
|  |  |  | Short Match 1 | 111100 |
| Fourth | 80 | Literal FF + Short Match 2 + End of Line | Literal FF | 1011111111 |
|  |  |  | Short Match 2 | 111101 |
|  |  |  | End of Line | 00000000 |

Joining the bit encodings for the CF2 operations of example 490 shown in the rightmost column of Table 2 leads to a 186-bit long concatenated bit string. The concatenated bit string is shown below and in FIG. 4G on line 3 of example 490:

101111111111100100000000010111111111111001000
00000010111111111111001000000000101111111111
110100000000011110010111111111100000000011110
01011111111100000000011110010111111111110100
000000

Continuing method 450, at block converter 304 can buffer the CF2 operations. Converter 304 can pad the concatenated bit string to fit 32-bit words by appending six zeroes to the 186-bit concatenated bit string, as the padded 192-bit concatenated bit string evenly fits into six 32-bit words. In FIG. 4G, line 4 of example 490 shows the resulting padded bit string in six words. The six words can then be output using little endian sequencing as shown on line 5 of example 490 and/or using big endian sequencing as shown in line 6 of example 490. Table 3 shows the words of the padded bit string in binary and hexadecimal formats using both little and big endian sequencings.

TABLE 3

| Word of Padded Concatenated Bit String (Line 4 of Example 490) | Corresponding Hexadecimal Values | Little Endian Sequencing (Line 5 of Example 490) | Big Endian Sequencing (Line 6 of Example 490) |
|---|---|---|---|
| 1011 1111 1111 1100 1000 0000 0010 1111 | BF FC 80 2F | BF FC 80 2F | 2F 80 FC BF |
| 1111 1111 0010 0000 0000 1011 1111 1111 | FF 20 0B FF | FF 20 0B FF | FF 0B 20 FF |
| 1100 1000 0000 0010 1111 1111 1111 1010 | C8 02 FF FA | C8 02 FF FA | FA FF 02 C8 |
| 0000 0000 1111 0010 1111 1111 1000 0000 | 00 F2 FF 80 | 00 F2 FF 80 | 80 FF F2 00 |
| 0011 1100 1011 1111 1110 0000 0000 1111 | 3C BF E0 0F | 3C BF E0 0F | 0F E0 BF 3C |
| 0010 1111 1111 1111 0100 0000 0000 0000 | 2F FF 40 00 | 2F FF 40 00 | 00 40 FF 2F |

After completing the operations of block 464, converter 304 can proceed to block 480 and provide an output including and/or based on the little endian sequencing and/or the big endian sequencing shown in example 490. After completing block 480, converter 304 can proceed to block 452, determine that the end of input has been reached, and proceed to block 454, indicate an end of input/end of file and complete the CF1 to CF2 conversion for example 490.

In respective examples 492, 494, and 496, the respective inputs to converter 304 are CF1 red plane row 5 excerpt 434p, CF1 green plane row 5 excerpt 436p, and CF1 blue plane row 5 excerpt 438p, which respectively represent red plane row 5 excerpt 422p, green plane row 5 excerpt 424p, and blue plane row 5 excerpt 426p. In examples 492, 494, 496, each of CF1 red plane row 5 excerpt 434p, CF1 green plane row 5 excerpt 436p, and CF1 blue plane row 5 excerpt 438 utilizes single bytes as data units, where each byte represents a color value/color plane. And, for examples 492, 494, and 492, CF2 encoded output of converter 304 utilizes single bytes as data units.

In example 492 illustrated in FIG. 4G, input to converter 304 is CF1 red plane row 5 excerpt 434p, which represents row 5 of red plane data 422 depicted in FIG. 4G as excerpt 422p. In example 492, CF1 red plane row 5 excerpt 434p utilizes a byte as a data unit, where each byte (or data unit) represents a color value for the red color plane. And in example 492, CF2 encoded output of converter 304 utilizes single bytes as data units.

As shown in FIG. 4G, red plane row 5 excerpt 422p includes the fifth row of red plane data 422, which has eight white "FF" pixels. A corresponding CF1 red plane row 5 excerpt 434p indicates the CF1 encoding of red plane row 5 excerpt 422p is "00 80" which is a non-repeated row, as the first byte is "00", and the entire row is white space/0xFF characters, as the second, and only remaining byte is "80".

Conversion example 492 shows operation of converter 304 converting excerpt 434p from first compression format CF1 to second compression format CF2 utilizing method 450. In example 492, converter 304 can first determine that the end of input is not yet been reached at block 452, and proceed to block 456 to read one byte "00" from the example input CF1-encoded line of "00 80" and set CC=0. At block 458, converter 304 can read in the remainder of input line IL, which is "80" into a buffer. At block 460, converter 304 can determine that, since CC=0, CC is not greater than 0, and proceed to block 462.

At block 462 of method 450, converter 304 can convert the remainder of input line IL to CF2 encoding. Block 462 involves looping through data read from buffered input line IL that represents one or more CF1 operations, each including a CF1 opcode and perhaps affiliated data, and converting the CF1 operation(s) to CF2 operations. In example 492, the CF1 input includes "80"; thus, the loop LOOP1 of block 462 will make one iteration.

During the LOOP1 iteration for example 492, converter 304 can process the CF1 white space operation by determining that the entirety of line 5 of red plane data 422 includes LEN−LP=8−0=8 white space byte values. As LEN−LP=8 in this example, and CF1 red plane row 5 excerpt 434p uses bytes as data items, the CF1 encoding of red plane row 5 excerpt 422p corresponds to an 8-byte input, shown in hexadecimal as "FF FF FF FF FF FF FF FF" (and also shown in red plane row 5 excerpt 422p).

Then, converter 304 can treat these eight "FF" bytes as a CF1 repeat data item operation with NRP=8 and RB=0xFF and generate a CF2 literal operation for an "FF" byte and a CF2 long match operation with a run length of 7 to generate the white space values to fill the line. These two CF2 operations are shown in FIG. 4G as line 2 of example 492 as "Literal FF+Long Match 7". Additionally a third CF2 operation for example 492 can be an end of line code as CF1 encoded excerpt 434p has been completely converted to the second compression format CF2. The third CF2 operation is shown on line 2 of example 492 as "End of Line".

Binary encoding for the three CF2 operations are shown on lines 3-5 of example 492 with: the CF2 Literal FF operation having a 10-bit binary encoding of 1011111111, the CF2 Long Match 7 operation having a 16-bit binary encoding of 1111110000000011, and the CF2 End of Line operation having an 8-bit binary encoding of 00000000. Joining the bit encodings for the CF2 operations of example 492 leads to a 34-bit long concatenated bit string, which is shown below and in FIG. 4G on line 6 of example 492 as:
1011111111111111100000000100000000

Continuing method 450, at block converter 304 can buffer the CF2 operations. Converter 304 can pad the concatenated bit string to fit 32-bit words by appending 30 zeroes to the 34-bit concatenated bit string, as a resulting 64-bit padded bit string evenly fits into two 32-bit words. In FIG. 4G, line 7 of example 492 shows the resulting padded bit string in two words. The two words can then be output using little endian sequencing as shown on line 8 of example 492 and/or using big endian sequencing as shown in line 9 of example 492. Table 4 shows the words of the padded bit string for example 492 in binary and hexadecimal formats using both little and big endian sequencings.

TABLE 4

| Word of Padded Bit String (Line 7 of Example 492) | Corresponding Hexadecimal Values | Little Endian Sequencing (Line 8 of Example 492) | Big Endian Sequencing (Line 9 of Example 492) |
|---|---|---|---|
| 1011 1111 1111 1111 0000 0000 1100 0000 | BF FF 00 C0 | BF FF 00 C0 | C0 00 FF BF |
| 0000 0000 0000 0000 0000 0000 0000 0000 | 00 00 00 00 | 00 00 00 00 | 00 00 00 00 |

After completing the operations of block 464, converter 304 can proceed to block 480 and provide an output including and/or based on the little endian sequencing and/or the big endian sequencing shown in example 492. After completing block 480, converter 304 can proceed to block 452, determine that the end of input has been reached, and proceed to block 454, indicate an end of input/end of file and complete the CF1 to CF2 conversion for example 492.

In example 494 illustrated in FIG. 4H, input to converter 304 is CF1 green plane row 5 excerpt 436p, which represents row 5 green plane data 424 depicted in FIG. 4H as excerpt 424p. In example 494, CF1 green plane row 5 excerpt 436p utilizes a byte as a data unit, where each byte (or data unit) represents a color value for the green color plane. And in example 494, CF2 encoded output of converter 304 utilizes single bytes as data units.

As shown in FIG. 4H, green plane row 5 excerpt 424p includes the fifth row of green plane data 424, which has four white "FF" pixels, followed by three black "00" pixels, and a final white "FF" pixel. A corresponding CF1 green plane row 5 excerpt 436p indicates the CF1 encoding of green plane row 5 excerpt 424p is "00 03 FF 02 00 80".

According to the first compression format CF1, the CF1 green plane row 5 excerpt 436p can be interpreted as follows:
- 00—this line (Line 5 of the green plane) is not repeated.
- 03—a first CF1 repeat data items opcode representing a run of length "03"+1=4 repeat data items
- FF—a first repeat data item
- 02—a CF2 second repeat data items opcode representing a run of length "02"+1=3 repeat data items
- 00—a second repeat data item
- 80—a CF1 white space opcode, indicating that the rest of the line includes white pixels.

Conversion example 494 shows operation of converter 304 converting excerpt 436p from first compression format CF1 to second compression format CF2 utilizing method 450. In example 494, converter 304 can first determine that the end of input is not yet been reached at block 452, and proceed to block 456 to read one byte "00" from the example input CF1-encoded line of "00 03 FF 02 00 80" and set CC=0. At block 458, converter 304 can read in the remainder of input line IL, which is "03 FF 02 00 80" into a buffer. At block 460, converter 304 can determine that, since CC=0, CC is not greater than 0, and proceed to block 462.

At block 462 of method 450, converter 304 can convert the remainder of input line IL to CF2 encoding. Block 462 involves looping through data read from buffered input line IL that represents one or more CF1 operations, each including a CF1 opcode and perhaps affiliated data, and converting the CF1 operation(s) to CF2 operations. In example 494, the CF1 input includes "00 03 FF 02 00 80" thus, the loop LOOP1 of block 462 can involve three iterations: a first iteration to process the first CF1 repeat data items opcode "03" and first repeat data item "FF", a second iteration to process the second CF1 repeat data items opcode "02" and second repeat data item "00", and a third iteration to process the CF1 white space opcode "80".

During the first LOOP1 iteration for example 494, converter 304 can carry out the procedures of block 462 of method 450 by: reading the first CF1 repeat data items opcode "03" from the buffer as CF1OP. As CF1OP="03" is in the range [0, 0x7F], converter 304 can determine that CF1OP is a CF1 repeat data items code, and subsequently read the first data item "FF" from the buffer as byte RB. Then, as CF1OP equals "03", converter 304 can set the number of repeated pixels variable NRP to 03+1=4 and update the line position variable LP=LP+NRP=0+4=4. As NRP is less than or equal to 4, converter 304 can generate a CF2 Literal operation encoding byte RB and a CF2 Short Match opcode encoding a run of length NRP−1=4−1=3. These two CF2 operations are shown in FIG. 4H on line 2 of example 494 as the first "Literal FF" operation and the "Short Match of 3" operation in that line.

During the second LOOP1 iteration for example 494, converter 304 can carry out the procedures of block 462 of method 450 by: reading the second CF1 repeat data items opcode "02" from the buffer as CF1OP. As CF1OP="02" is in the range [0, 0x7F], converter 304 can determine that CF1OP is a CF1 repeat data items code, and subsequently read the second data item "00" from the buffer as byte RB. Then, as CF1OP equals "02", converter 304 can set the number of repeated pixels variable NRP to 02+1=3 and update the line position variable LP=LP+NRP=4+3=7. As NRP is less than or equal to 4, converter 304 can generate a CF2 Literal operation encoding byte RB and a CF2 Short Match opcode encoding a run of length NRP−1=3−1=2. These two CF2 operations are shown on line 2 of example 494 as the "Literal 00" operation and the "Short Match of 2" operation in that line.

During the third LOOP1 iteration for example 494, converter 304 can process the CF1 white space operation by determining that the remainder of line 5 of green plane data 424 is to be filled with LEN−LP=8−7=1 white space byte values. As LEN−LP=1 in this example, and CF1 green plane row 5 excerpt 436p uses bytes as data items, the CF1 white space operation "80" corresponds to one "FF" byte at the end of line 5 of green plane data 424.

Then, converter 304 can treat the single "FF" byte as a CF1 repeat data item operation with NRP=1 and RB=0xFF and generate a CF2 literal operation for an "FF" byte, shown on line 2 of example 494 as the second "Literal FF" operation in that line. Additionally a CF2 end of line operation can be emitted as CF1 green plane row 5 excerpt 436p has been completely converted to the second compression format CF2. The CF2 end of line operation is shown on line 2 of example 494 as "End of Line".

Binary encoding for the six CF2 operations are shown on lines 3-8 of example 494 with: the first and second CF2 Literal FF operations each having a 10-bit binary encoding of 1011111111 as shown on respective lines 3 and 7, the CF2 Short Match of 3 operation having a 6-bit binary encoding of 111110 as shown on line 4, the CF2 Literal 00 operation having a 10-bit binary encoding of 1000000000 as shown on line 5, the CF2 Short Match of 2 operation having a 6-bit binary encoding of 111101 as shown on line 6, and the CF2 End of Line operation having an 8-bit binary encoding of 00000000 as shown on line 8 of example 494. Joining the bit encodings for these CF2 operations leads to a 50-bit long concatenated bit string, shown below and in FIG. 4H on line 9 of example 494 as:

10111111111111101000000000111101101111111100000000

Continuing method 450, at block converter 304 can buffer the CF2 operations. Converter 304 can pad the concatenated bit string to fit 32-bit words by appending 14 zeroes to the 50-bit concatenated bit string, as a resulting 64-bit padded bit string evenly fits into two 32-bit words. In FIG. 4H, line 10 of example 494 shows the resulting padded bit string in two words. The two words can then be output using little endian sequencing as shown on line 11 of example 494 and/or using big endian sequencing as shown in line 12 of example 494. Table 5 shows the words of the padded bit string for example 494 in binary and hexadecimal formats using both little and big endian sequencings.

TABLE 5

| Word of Padded Bit String (Line 10 of Example 494) | Corresponding Hexadecimal Values | Little Endian Sequencing (Line 11 of Example 494) | Big Endian Sequencing (Line 12 of Example 494) |
|---|---|---|---|
| 1011 1111 1111 1110 1000 0000 0011 1101 | BF FE 80 3D | BF FE 80 3D | 3D 80 FE BF |
| 1011 1111 1100 0000 0000 0000 0000 0000 | BF C0 00 00 | BF C0 00 00 | 00 00 C0 BF |

After completing the operations of block 464, converter 304 can proceed to block 480 and provide an output including and/or based on the little endian sequencing and/or the big endian sequencing shown in example 494. After completing block 480, converter 304 can proceed to block 452, determine that the end of input has been reached, and proceed to block 454, indicate an end of input/end of file and complete the CF1 to CF2 conversion for example 494.

In example 496 illustrated in FIG. 4H, input to converter 304 is CF1 blue plane row 5 excerpt 438p, which represents row 5 blue plane data 424 depicted in FIG. 4H as excerpt 426p. In example 496, CF1 blue plane row 5 excerpt 438p utilizes a byte as a data unit, where each byte (or data unit) represents a color value for the blue color plane. And in example 494, CF2 encoded output of converter 304 utilizes single bytes as data units.

As shown in FIG. 4H, blue plane row 5 excerpt 426p includes the fifth row of blue plane data 426, which has three black "00" pixels, followed by a white "FF" pixel, followed by three black "00" pixels, and a final white "FF" pixel. A corresponding CF1 blue plane row 5 excerpt 438p indicates the CF1 encoding of blue plane row 5 excerpt 426p is "00 02 00 00 FF 02 00 80".

According to the first compression format CF1, the CF1 blue plane row 5 excerpt 438p can be interpreted as follows:
00—this line (Line 5 of the blue plane) is not repeated.
02—a first CF1 repeat data items opcode representing a run of length "02"+1=3 repeat data items
00—a first repeat data item
00—a second CF1 repeat data items opcode representing a run of length "00"+1=1 repeat data item
FF—a second repeat data item
02—a third CF1 repeat data items opcode representing a run of length "02"+1=3 repeat data items
00—a third repeat data item
80—a CF1 white space opcode, indicating that the rest of the line includes white pixels.

Conversion example 496 shows operation of converter 304 converting excerpt 438p from first compression format CF1 to second compression format CF2 utilizing method 450. In example 496, converter 304 can first determine that the end of input is not yet been reached at block 452, and proceed to block 456 to read one byte "00" from the example input CF1-encoded line of "00 02 00 00 FF 02 00 80" and set CC=0. At block 458, converter 304 can read in the remainder of input line IL, which is "02 00 00 FF 02 00 80" into a buffer. At block 460, converter 304 can determine that, since CC=0, CC is not greater than 0, and proceed to block 462.

At block 462 of method 450, converter 304 can convert the remainder of input line IL to CF2 encoding. Block 462 involves looping through data read from buffered input line IL that represents one or more CF1 operations, each including a CF1 opcode and perhaps affiliated data, and converting the CF1 operation(s) to CF2 operations. In example 496, the CF1 input includes "02 00 00 FF 02 00 80" thus, the loop LOOP1 of block 462 can involve four iterations: a first iteration to process the first CF1 repeat data items opcode "02" and first repeat data item "00", a second iteration to process the second CF1 repeat data items opcode "00" and second repeat data item "FF", a third iteration to process the third CF1 repeat data items opcode "02" and third repeat data item "00", and a fourth iteration to process the CF1 white space opcode "80"

During the first LOOP1 iteration for example 496, converter 304 can carry out the procedures of block 462 of method 450 by: reading the first CF1 repeat data items opcode "02" from the buffer as CF1OP. As CF1OP="02" is in the range [0, 0x7F], converter 304 can determine that CF1OP is a CF1 repeat data items code, and subsequently read the first data item "00" from the buffer as byte RB. Then, as CF1OP equals "02", converter 304 can set the number of repeated pixels variable NRP to 02+1=3 and update the line position variable LP=LP+NRP=0+3=3. As NRP is less than or equal to 4, converter 304 can generate a CF2 Literal operation encoding byte RB and a CF2 Short Match opcode encoding a run of length NRP−1=3−1=2. These two CF2 operations are shown in FIG. 4H on line 2 of example 496 as the first "Literal 00" operation and the first "Short Match of 2" operation in that line.

During the second LOOP1 iteration for example 496, converter 304 can carry out the procedures of block 462 of method 450 by: reading the second CF1 repeat data items opcode "00" from the buffer as CF1OP. As CF1OP="00" is in the range [0, 0x7F], converter 304 can determine that CF1OP is a CF1 repeat data items code, and subsequently read the second data item "FF" from the buffer as byte RB. Then, as CF1OP equals "00", converter 304 can set the number of repeated pixels variable NRP to 00+1=1 and update the line position variable LP=LP+NRP=3+1=4. As NRP is less than or equal to 4, converter 304 can generate a CF2 Literal operation encoding byte RB and a CF2 Short Match opcode encoding a run of length NRP−1=2−1=1. These two CF2 operations are shown on line 2 of example 496 as the first "Literal FF" operation in that line.

During the third LOOP1 iteration for example 496, converter 304 can carry out the procedures of block 462 of method 450 by: reading the third CF1 repeat data items opcode "02" from the buffer as CF1OP. As CF1OP="02" is in the range [0, 0x7F], converter 304 can determine that CF1OP is a CF1 repeat data items code, and subsequently read the third data item "00" from the buffer as byte RB. Then, as CF1OP equals "02", converter 304 can set the number of repeated pixels variable NRP to 02+1=3 and update the line position variable LP=LP+NRP=4+3=7. As NRP is less than or equal to 4, converter 304 can generate a CF2 Literal operation encoding byte RB and a CF2 Short Match opcode encoding a run of length NRP−1=3−1=2. These two CF2 operations are shown in FIG. 4H on line 2 of example 496 as the second "Literal 00" operation and the second "Short Match of 2" operation in that line.

During the fourth LOOP1 iteration for example 496, converter 304 can process the CF1 white space operation by determining that the remainder of line 5 of green plane data 424 is to be filled with LEN−LP=8−7=1 white space byte values. As LEN−LP=1 in this example, and CF1 blue plane row 5 excerpt 438p uses bytes as data items, the CF1 white space operation "80" corresponds to one "FF" byte at the end of line 5 of blue plane data 426.

Then, converter 304 can treat the single "FF" byte as a CF1 repeat data item operation with NRP=1 and RB=0xFF and generate a CF2 literal operation for an "FF" byte, shown on line 2 of example 496 as the second "Literal FF" operation in that line. Additionally a CF2 end of line operation can be emitted as CF1 blue plane row 5 excerpt 438p has been completely converted to the second compression format CF2. The CF2 end of line operation is shown on line 2 of example 496 as "End of Line".

Binary encoding for the six CF2 operations are shown on lines 3-9 of example 494 with: the first and second CF2 Literal 00 operations each having a 10-bit binary encoding of 1000000000 as shown on respective lines 3 and 6, the first and second CF2 Short Match of 2 operations having a 6-bit binary encoding of 111101 as shown on respective lines 4 and 7, the first and second CF2 Literal FF operations each having a 10-bit binary encoding of 1011111111 as shown on respective lines 5 and 8, and the CF2 End of Line operation having an 8-bit binary encoding of 00000000 as shown on line 9 of example 496. Joining the bit encodings for these CF2 operations leads to a 60-bit long concatenated bit string, shown below and in FIG. 4H on line 10 of example 496 as:
100000000011110110111111111000000000111101101111111100000000

Continuing method 450, at block converter 304 can buffer the CF2 operations. Converter 304 can pad the concatenated bit string to fit 32-bit words by appending 4 zeroes to the 60-bit concatenated bit string, as a resulting 64-bit padded bit string evenly fits into two 32-bit words. In FIG. 4H, line 11 of example 496 shows the resulting padded bit string in two words. The two words can then be output using little endian sequencing as shown on line 12 of example 496 and/or using big endian sequencing as shown in line 13 of example 496. Table 6 shows the words of the padded bit string for example 496 in binary and hexadecimal formats using both little and big endian sequencings.

TABLE 6

| Word of Padded Bit String (Line 11 of Example 496) | Corresponding Hexadecimal Values | Little Endian Sequencing (Line 12 of Example 496) | Big Endian Sequencing (Line 13 of Example 496) |
| --- | --- | --- | --- |
| 1000 0000 0011 1101 1011 1111 1110 0000 | 80 3D BF E0 | 80 3D BF E0 | E0 BF 3D 80 |
| 0000 1111 0110 1111 1111 0000 0000 0000 | 0F 6F F0 00 | 0F 6F F0 00 | 00 F0 6F 0F |

After completing the operations of block 464, converter 304 can proceed to block 480 and provide an output including and/or based on the little endian sequencing and/or the big endian sequencing shown in example 496. After completing block 480, converter 304 can proceed to block 452, determine that the end of input has been reached, and proceed to block 454, indicate an end of input/end of file and complete the CF1 to CF2 conversion for example 496.

Scenario 400 further includes CF1 to CF2 conversion of interleaved color plane data 420, which is described in the attached Appendix to this specification, which is incorporated herein by reference. The Appendix to the specification describes aspects of scenario 400 where converter 304 converts interleaved color plane data 420 as encoded in first compression format CF1 as CF1 encoded interleaved color data 432 to second compression format CF2. In the embodiments of converter 304 described in the Appendix, CF1 interleaved color data 432 is converted to the second compression format CF2 into three color plane outputs: one output for the red color plane, one output for the green color plane, and one output for the blue color plane. After completing the CF1 to CF2 conversion of interleaved color plane data 420, scenario 400 can be completed.

V. Example Methods of Operation

Figure 5:
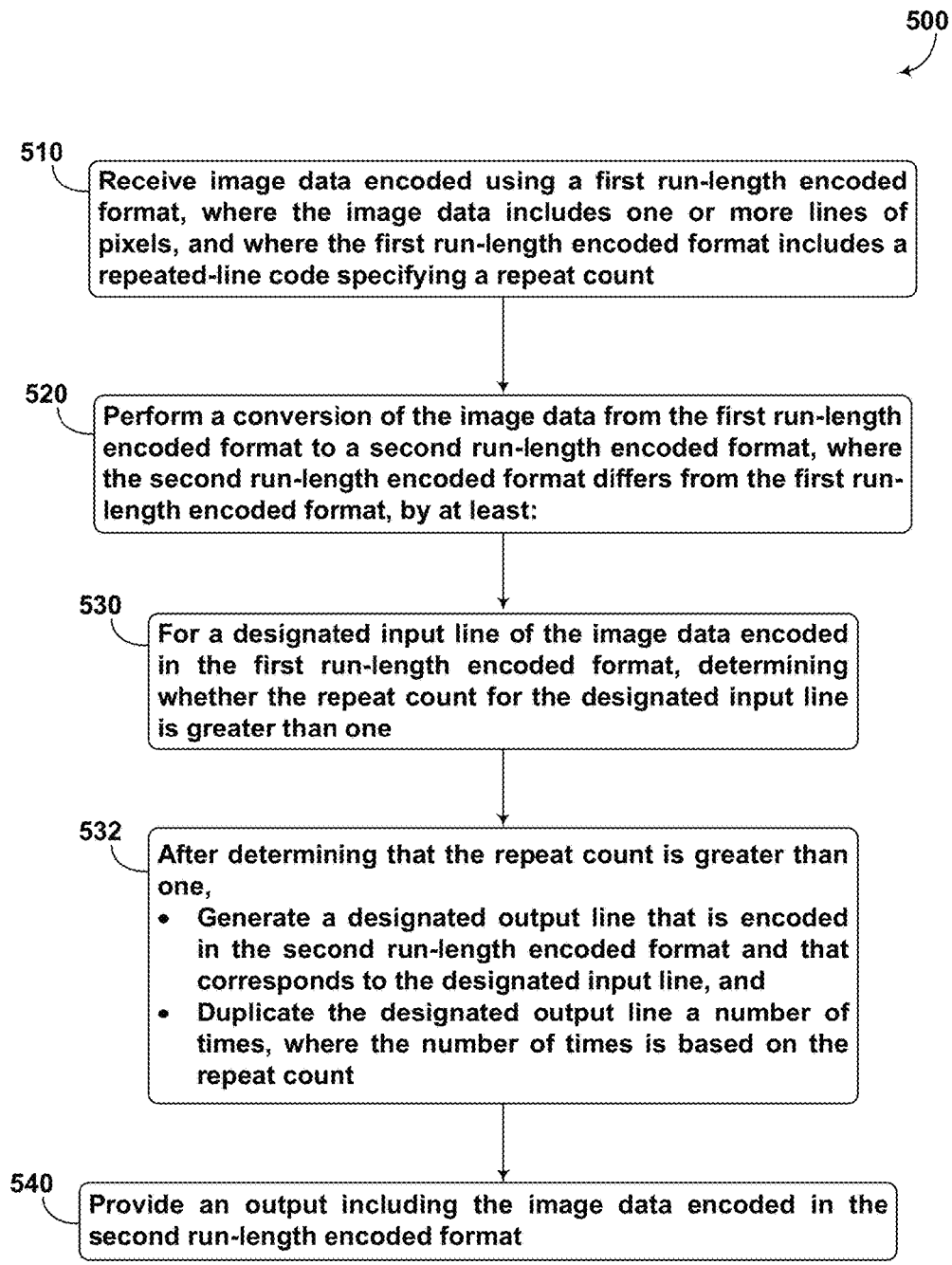
FIG. 5 shows a flowchart for a method, according to an example embodiment.

FIG. 5 shows a flowchart for method 500, according to an example embodiment. Method 500 can be carried out by a computing device, such as computing device 200. Method 500 can begin at block 510, where the computing device can receive image data that is encoded using a first run-length encoded format, such as discussed above in the context of at least FIGS. 3-4H. The image data can include one or more lines of pixels, and the first run-length encoded format can include a repeated-line code specifying a repeat count, such as discussed above in the context of at least FIGS. 3-4H.

In some embodiments, the first run-length encoded format can include an end-of-line code indicating that a remainder of the pixels in a particular line of the one or more lines of pixels has a predetermined value, such as discussed above in the context of at least FIGS. 3-4H.

At block 520, the computing device can perform a conversion of the image data from the first run-length encoded format to a second run-length encoded format, where the second run-length encoded format differs from the first run-length encoded format, such as discussed above in the context of at least FIGS. 4C-4H. Performing the conversion can include carrying out the procedures of blocks 530 and 532.

In some embodiments, the second run-length encoded format can include a plurality of codes that can include: a literal code indicating a specific value of image data, a match code indicating a number of matching values of image data, and a near match code indicating a successor value of image data is within a predetermined range of values of a predecessor value of the image data, such as discussed above in the context of at least FIGS. 4D-4H. In particular of these embodiments, the specific value of image data, the matching values, the successor value and the predecessor value can each be based on pixels of the image data, such as discussed above in the context of at least FIGS. 4D-4H.

At block 530, the computing device can determine whether the repeat count for designated input line of the image data encoded in the first run-length encoded format is greater than one, such as discussed above in the context of at least FIGS. 4E-4H.

At block 532, the computing device can, after determining that the repeat count is greater than one: generate a designated output line that is encoded in the second run-length encoded format and that corresponds to the designated input line and duplicate the designated output line a number of times, where the number of times is based on the repeat count, such as discussed above in the context of at least FIGS. 4E-4H.

In some embodiments, the first run-length encoded format can include a repeated-pixel code indicating a designated pixel is repeated a designated number of times. Then, performing the conversion can further include: reading an input code from the image data encoded using the first run-length encoded format, where the input code is associated with a particular line of the one or more lines of pixels, determining whether the input code is the repeated-pixel code; and after determining that the code is the repeated-pixel code, generating a portion of the conversion including the literal code, such as discussed above in the context of at least FIGS. 4E-4H. In particular of these embodiments, generating the portion of the conversion can include: generating a first portion of the conversion including the literal code and the designated pixel; determining whether the designated number of times the designated pixel is repeated exceeds one; and after determining that the designated number of times exceeds one, generating a second portion of the conversion including the match code, such as discussed above in the context of at least FIGS. 4E-4H. In more particular of these embodiments, the match code can be selected from a short match code or a long match code. Then, generating the second portion of the conversion can include: determining whether the designated number of times exceeds a long-match threshold; and after determining that the designated number of times does exceed the long-match threshold, generating the second portion of the conversion that includes the long match code, such as discussed above in the context of at least FIGS. 4E-4H. In even more particular of these embodiments, generating the second portion of the conversion can include: after determining that the designated number of times does not exceed the long-match threshold, generating the second portion of the conversion that includes the short match code, such as discussed above in the context of at least FIGS. 4E-4H.

At block 540, the computing device can provide an output including the image data encoded in the second run-length encoded format. In some embodiments, the pixels of the image data can be separable into image data for a plurality of color planes of image data. The image data encoded in the second run-length encoded format can include a first portion corresponding to a first color plane of the plurality of color planes and a second portion corresponding to a second color plane of the plurality of color planes, where the first portion is separable from the second portion, and where the first and second color planes differ, such as discussed above in the context of at least FIGS. 4E-4H. In other embodiments, the pixels of the image data can be separable into image data for a plurality of color planes of image data, and the image data encoded in the second run-length encoded format can intermingle the image data for the plurality of color planes, such as discussed above in the context of at least FIG. 4E.

In even other embodiments, the computing device can include: a communications interface to a second computing device that is configured to decode the image data encoded in the second run-length encoded format. Then, providing the output can include communicating the output including the image data encoded in the second run-length encoded format to the second computing device via the communications interface, such as discussed above in the context of at least FIG. 3.

Figure 6:
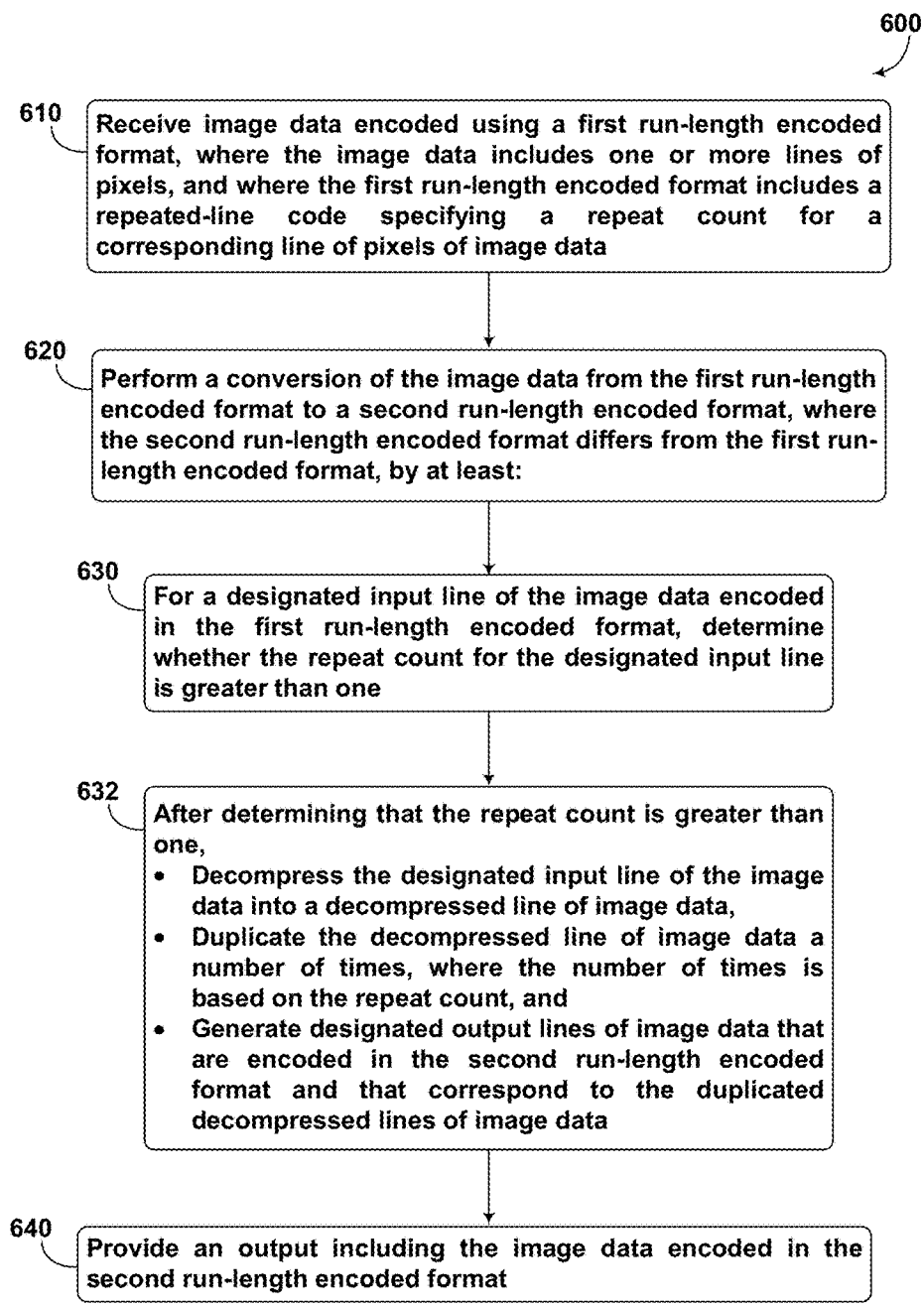
FIG. 6 shows a flowchart for another method, according to an example embodiment.

FIG. 6 shows a flowchart for method 600, according to an example embodiment. Method 600 can be carried out by a computing device, such as computing device 200. Method 600 can begin at block 610, where the computing device can receive image data that is encoded using a first run-length encoded format, such as discussed above in the context of at least FIGS. 3-4H. The image data can include one or more lines of pixels, and the first run-length encoded format can include a repeated-line code specifying a repeat count for a corresponding line of pixels of image data, such as discussed above in the context of at least FIGS. 3-4H.

In some embodiments, the first run-length encoded format can include an end-of-line code indicating that a remainder of the pixels in a particular line of the one or more lines of pixels has a predetermined value, such as discussed above in the context of at least FIGS. 3-4H.

At block 620, the computing device can perform a conversion of the image data from the first run-length encoded format to a second run-length encoded format, where the second run-length encoded format differs from the first run-length encoded format, such as discussed above in the context of at least FIGS. 4C-4H. Performing the conversion can include carrying out the procedures of blocks 630 and 632.

In some embodiments, the second run-length encoded format can include a plurality of codes that can include: a literal code indicating a specific value of image data, a match code indicating a number of matching values of image data, and a near match code indicating a successor value of image data is within a predetermined range of values of a predecessor value of the image data, such as discussed above in the context of at least FIGS. 4D-4H. In particular of these embodiments, the specific value of image data, the matching values, the successor value and the predecessor value can each be based on pixels of the image data, such as discussed above in the context of at least FIGS. 4D-4H.

At block 630, the computing device can, for a designated input line of the image data encoded in the first run-length encoded format, determine whether the repeat count for the designated input line is greater than one, such as discussed above in the context of at least FIGS. 4E-4H.

At block 632, after determining that the repeat count is greater than one, the computing device can: decompress the designated input line of the image data into a decompressed line of image data, duplicate the decompressed line of image data a number of times, wherein the number of times is based on the repeat count, and generate designated output lines of image data that are encoded in the second run-length encoded format and that correspond to the duplicated decompressed lines of image data, such as discussed above in the context of at least FIGS. 4E-4H.

In some embodiments, the first run-length encoded format can include a repeated-pixel code indicating a designated pixel is repeated a designated number of times. Then, performing the conversion can further include: reading an input code from the image data encoded using the first run-length encoded format, where the input code is associated with a particular line of the one or more lines of pixels, determining whether the input code is the repeated-pixel code; and after determining that the code is the repeated-pixel code, generating a portion of the conversion including the literal code, such as discussed above in the context of at least FIGS. 4E-4H. In particular of these embodiments, generating the portion of the conversion can include: generating a first portion of the conversion including the literal code and the designated pixel; determining whether the designated number of times the designated pixel is repeated exceeds one; and after determining that the designated number of times exceeds one, generating a second portion of the conversion including the match code, such as discussed above in the context of at least FIGS. 4E-4H. In more particular of these embodiments, the match code can be selected from a short match code or a long match code. Then, generating the second portion of the conversion can include: determining whether the designated number of times exceeds a long-match threshold; and after determining that the designated number of times does exceed the long-match threshold, generating the second portion of the conversion that includes the long match code, such as discussed above in the context of at least FIGS. 4E-4H. In even more particular of these embodiments, generating the second portion of the conversion can include: after determining that the designated number of times does not exceed the long-match threshold, generating the second portion of the conversion that includes the short match code, such as discussed above in the context of at least FIGS. 4E-4H.

At block 640, the computing device can provide an output including the image data encoded in the second run-length encoded format. In some embodiments, the pixels of the image data can be separable into image data for a plurality of color planes of image data. The image data encoded in the second run-length encoded format can include a first portion corresponding to a first color plane of the plurality of color planes and a second portion corresponding to a second color plane of the plurality of color planes, where the first portion is separable from the second portion, and where the first and second color planes differ, such as discussed above in the context of at least FIGS. 4E-4H. In other embodiments, the pixels of the image data can be separable into image data for a plurality of color planes of image data, and the image data encoded in the second run-length encoded format can intermingle the image data for the plurality of color planes, such as discussed above in the context of at least FIG. 4E.

In even other embodiments, the computing device can include: a communications interface to a second computing device that is configured to decode the image data encoded in the second run-length encoded format. Then, providing the output can include communicating the output including the image data encoded in the second run-length encoded format to the second computing device via the communications interface, such as discussed above in the context of at least FIG. 3.

The illustrative embodiments described in the detailed description, figures, and claims are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

With respect to any or all of the ladder diagrams, scenarios, and flow charts in the figures and as discussed herein, each block and/or communication may represent a processing of information and/or a transmission of information in accordance with example embodiments. Alternative embodiments are included within the scope of these example embodiments. In these alternative embodiments, for example, functions described as blocks, transmissions, communications, requests, responses, and/or messages may be executed out of order from that shown or discussed, including substantially concurrent or in reverse order, depending on the functionality involved. Further, more or fewer blocks and/or functions may be used with any of the ladder diagrams, scenarios, and flow charts discussed herein, and these ladder diagrams, scenarios, and flow charts may be combined with one another, in part or in whole.

A block that represents a processing of information may correspond to circuitry that can be configured to perform the specific logical functions of a method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

APPENDIX TO THE SPECIFICATION

Example CF1 to CF2 Conversion of Interleaved Color Plane Data 420

This appendix to the specification describes aspects of scenario 400 where converter 304 converts interleaved color plane data 420 as encoded in first compression format CF1 as CF1 encoded interleaved color data 432 to second compression format CF2. In the embodiments of converter 304 described in this Appendix, CF1 interleaved color data 432 is converted to the second compression format CF2 into three color plane outputs: one output for the red color plane, one output for the green color plane, and one output for the blue color plane. Also, in the embodiments described in this Appendix, each CF1 operation read from input line IL can be used to generate an uncompressed data representation in each of the three color planes, and then converted from the uncompressed data representation to second compression format CF2. In the uncompressed representation, the data is padded and converted from little endian to big endian sequencing.

Interleaved Color Plane Data 420, shown in FIG. 4A, is illustrated below:

| | Interleaved Pixel Column (hex values) | | | | | | | | | | | | | | | |
|---|---|---|---|---|---|---|---|---|---|---|---|---|---|---|---|---|
| | 1 | | 2 | | 3 | | 4 | | 5 | | 6 | | 7 | | 8 | |
| 1 | FF FF | FF | FF FF | FF | FF FF | FF | FF FF | FF | FF FF | FF | FF FF | FF | FF FF | FF | FF FF | |
| 2 | FF FF | FF | FF FF | FF | FF FF | FF | FF FF | FF | FF FF | FF | FF FF | FF | FF FF | FF | FF FF | FF |
| 3 | FF 00 | 00 | 00 00 | FF | 00 FF | 00 | FF FF | FF | FF FF | FF | FF FF | FF | FF FF | FF | FF FF | FF |
| 4 | FF FF | FF | FF 00 | FF | 00 00 | FF | 00 00 | FF | 00 FF | FF | FF 00 | 00 | FF 00 | 00 | FF FF | FF |

-continued

| | Interleaved Pixel Column (hex values) | | | | | | | | | | | | | | | | | | | | | | |
|---|---|---|---|---|---|---|---|---|---|---|---|---|---|---|---|---|---|---|---|---|---|---|---|
| | 1 | | | 2 | | | 3 | | | 4 | | | 5 | | | 6 | | | 7 | | | 8 | |
| Line 5 | FF 00 | | FF | FF 00 | | FF | FF 00 | | FF | FF | | FF FF | FF | 00 | 00 | FF | 00 | 00 | FF | 00 | 00 | FF FF | | FF |
| 6 | 00 | 00 | FF | 00 | 00 | FF | 00 | 00 | FF | 00 | 00 | FF | 00 | 00 | FF | 00 | 00 | FF | 00 | 00 | FF | 00 | 00 | FF |
| 7 | 00 | FF | 00 | 00 | FF | 00 | 00 | FF | 00 | 00 | FF | 00 | 00 | FF | 00 | 00 | FF | 00 | 00 | FF | 00 | 00 | FF | 00 |
| 8 | FF | 00 | 00 | FF | 00 | 00 | FF | 00 | 00 | FF | 00 | 00 | FF | 00 | 00 | FF | 00 | 00 | FF | 00 | 00 | FF | 00 | 00 |

And corresponding CF1 Encoded Interleaved Color Data 432 of FIG. 4C is illustrated below:

```
1        01 80
2
3        00 FE FF 00 00 00 00 FF 00 FF 00 80
4        00 00 FF FF FF 02 00 FF 00 00 FF FF FF 01 00 00 FF 80
Pixel 5  00 02 FF FF 00 00 FF FF FF 02 FF 00 00 80
Line 6   00 07 00 00 FF
7        00 07 00 FF 00
8        00 07 FF 00 00
```

Conversion of Lines 1 and 2 of CF1 Encoded Interleaved Color Data 432 to CF2

The first two lines, Lines 1 and 2, of color matrix 410 are:
W W W W W W W W
W W W W W W W W Lines 1 and 2 of color plane data 420, representing color matrix 410, includes 16 white pixels that can be expressed in hexadecimal format as follows:
FF FF FF FF FF FF FF FF FF FF FF FF FF FF FF FF FF FF FF FF FF FF FF
FF FF FF FF FF FF FF FF FF FF FF FF FF FF FF FF FF FF FF FF FF FF FF CF1 encoded interleaved color data 432 indicates that these 16 pixels of Lines 1 and 2 can be represented using first compression format CF1 in hexadecimal format as follows:
01 80

According to the first compression format CF1, the first byte of the above CF1 byte sequence can be interpreted as follows:
01—this line (Line 1) is repeated once.

In the context of method 450, the above "01" byte indicates that CC=1. As the copy output option is chosen for this example, the procedures of block 474 can determine that the remainder of this input line can be interpreted as
80—a CF1 white space opcode, indicating that the rest of the line includes white pixels.

That is, in this example, the CF1 white space opcode "80" indicates that Line 1 includes eight white pixels. Also, the first byte of the above CF1 byte sequence "01" indicates that Line 1 is repeated once. Thus, the CF1 byte sequence indicates that both Lines 1 and 2 include eight white pixels.

The corresponding Lines 1 and 2 of color plane data 420 represent these repeated white pixels, producing the color plane values below:
Red color plane FF FF FF FF FF FF FF FF FF FF FF FF FF FF FF FF
Green color plane FF FF FF FF FF FF FF FF FF FF FF FF FF FF FF FF
Blue color plane FF FF FF FF FF FF FF FF FF FF FF FF FF FF FF FF CF2 compression using little endian sequencing using the copy output option (blocks 474-478) of method 450 for each of the red, green, and blue color planes is shown below:
C0 00 FF BF 00 00 00 00 C0 00 FF BF 00 00 00 00

CF2 operations for each of the three color planes generated using the copy output option (involving execution of blocks 476 and 478 of method 450) are shown below:
LITERAL_OP–0x200+0xFF, 10 bits
LONG_MATCH_OPCODE (0xFC00)+repeat count (7)–MATCH_SHORT_MATCH_RUN_LENGTH (4), 16 bits
END_OF_LINE_OP (0), 8 bits
LITERAL_OP–0x200+0xFF, 10 bits
LONG_MATCH_OPCODE (0xFC00)+repeat count (7)–MATCH_SHORT_MATCH_RUN_LENGTH (4), 16 bits
END_OF_LINE_OP (0), 8 bits Conversion of Line 3 of CF1 Encoded Interleaved Color Data 432 to CF2

Line 3 of color matrix 410 is:
R B G W W W W W

Line 3 of color plane data 420, representing color matrix 410, starts with 3 non-repeated pixels—a red pixel, a blue pixel, and a green pixel, which can be expressed in hexadecimal format as follows:
FF 00 00 00 00 FF 00 FF 00 and concludes with 5 repeated white pixels, which can be represented as:
FF FF FF FF FF FF FF FF FF FF FF FF FF FF FF CF1 encoded interleaved color data 432 indicates that these 8 pixels of Line 3 can be represented using first compression format CF1 in hexadecimal format as follows:
00 FE FF 00 00 00 00 FF 00 FF 00 80

According to the first compression format CF1, the first byte of the above CF1 byte sequence can be interpreted as follows:
00—this line (Line 3) is not repeated.

In the context of method 450, the above "00" byte indicates that CC=0, and in this example, CF1 is encoding three-byte pixel values, so SZ=3. Then, the procedures of block 464 can determine that the remainder of the above CF1 byte sequence represents:
FE—a CF1 non-repeat data items opcode representing a set of length 257-254 (the decimal value of the input opcode "FE")=3 non-repeat data items
FF 00 00 00 00 FF 00 FF 00—the 3 non-repeat data items (in this case, a red pixel, a blue pixel, and a green pixel)
80—a CF1 white space opcode, indicating that the rest of the line includes white pixels.

In the embodiments illustrated in this Appendix, CF1 interleaved color data 432 is converted to the second compression format CF2 into three color plane outputs: one output for the red color plane, one output for the green color plane, and one output for the blue color plane. Then, the eight repeated red pixels of Line 3 can be represented in each of the red, green, and blue color planes as follows:
Red color plane FF 00 00 FF FF FF FF FF
Green color plane 00 00 FF FF FF FF FF FF
Blue color plane 00 FF 00 FF FF FF FF FF For the red color plane, the 3 non-repeated pixels (i.e., the first three pixels) of Line 3 represented using the CF1 non-repeat data item opcode "FE" as discussed above can be expressed as:

FF 00 00

In some embodiments, method 450 can process the uncompressed stream as big-endian 32-bit word content. That is, the above three bytes can be zero padded to complete the 32-bit word producing the following sequence of bytes:

FF 00 00 00

The above input can be considered to use little-endian sequencing. Converting to big-endian sequencing produces the following sequence of bytes:

00 00 00 FF

CF2 compression of the above sequence of bytes using little endian sequencing can be expressed in hexadecimal format as follows:

C0 BF 3D 80 00 00 00 00

The CF2 compression can include the following CF2 operations:

LITERAL_OP−0x200+0x00, 10 bits
SHORT_MATCH_OP (0x3C)+repeat_count (2)−1, 6 bits
LITERAL_OP−0x200+0xFF, 10 bits
END_OF_LINE_OP (0), 8 bits For the red color plane, the 5 repeated pixels (i.e., the last five pixels) of Line 3 indicated by the CF1 white space opcode "80" discussed above can be expressed as:

FF FF FF FF FF

After 32-bit word padding, these pixels can be represented as:

FF FF FF FF FF 00 00 00

Converting the above padded byte sequence to big-endian sequencing produces the following sequence of bytes:

FF FF FF FF 00 00 00 FF

CF2 compression of the above sequence of bytes using little endian sequencing can be expressed in hexadecimal format as follows:

3D 80 FE BF 00 00 C0 BF

The CF2 compression can include the following CF2 operations:

LITERAL_OP−0x200+0xFF, 10 bits
SHORT_MATCH_OP (0x3C)+repeat_count (3)−1, 6 bits
LITERAL_OP−0x200+0x0, 10 bits
SHORT_MATCH_OP (0x3C)+repeat_count (2)−1, 6 bits
LITERAL_OP−0x200+0xFF, 10 bits
END_OF_LINE_OP (0), 8 bits For the green color plane, the 3 non-repeated pixels (i.e., the first three pixels) of Line 3 represented using the CF1 non-repeat data item opcode "FE" as discussed above can be expressed as:

00 00 FF

After 32-bit word padding, these pixels can be represented as:

00 00 FF 00

Converting the above padded byte sequence to big-endian sequencing produces the following sequence of bytes:

00 FF 00 00

CF2 compression of the above sequence of bytes using little endian sequencing can be expressed in hexadecimal format as follows:

03 F8 2F 80 00 00 00 C0

The CF2 compression can include the following CF2 operations:

LITERAL_OP−0x200+0x0, 10 bits
LITERAL_OP−0x200+0xFF, 10 bits
LITERAL_OP−0x200+0x0, 10 bits SHORT_MATCH_OP (0x3C)+repeat_count (1)−1, 6 bits
END_OF_LINE_OP (0), 8 bits For the green color plane, the 5 repeated pixels (i.e., the last five pixels) of Line 3 indicated by the CF1 white space opcode "80" discussed above can be expressed as:

FF FF FF FF FF

After 32-bit word padding, these pixels can be represented as:

FF FF FF FF FF 00 00 00

Converting the above padded byte sequence to big-endian sequencing produces the following sequence of bytes:

FF FF FF FF 00 00 00 FF

CF2 compression of the above sequence of bytes using little endian sequencing can be expressed in hexadecimal format as follows:

3D 80 FE BF 00 00 C0 BF

The CF2 compression can include the following CF2 operations:

LITERAL_OP−0x200+0xFF, 10 bits
SHORT_MATCH_OP (0x3C)+repeat_count (3)−1, 6 bits
LITERAL_OP−0x200+0x0, 10 bits
SHORT_MATCH_OP (0x3C)+repeat_count (2)−1, 6 bits
LITERAL_OP−0x200+0xFF, 10 bits For the blue color plane, the 3 non-repeated pixels (i.e., the first three pixels) of Line 3 represented using the CF1 non-repeat data item opcode "FE" can be expressed as:

00 FF 00

After 32-bit word padding, these pixels can be represented as:

00 FF 00 00

Converting the above padded byte sequence to big-endian sequencing produces the following sequence of bytes:

00 00 FF 00

CF2 compression of the above sequence of bytes using little endian sequencing can be expressed in hexadecimal format as follows:

E0 BF 3C 80 00 00 00 00

The CF2 compression can include the following CF2 operations:

LITERAL_OP−0x200+0x0, 10 bits
SHORT_MATCH_OP (0x3C)+repeat_count (1)−1, 6 bits
LITERAL_OP−0x200+0xFF, 10 bits
LITERAL_OP−0x200+0x0, 10 bits
END_OF_LINE_OP (0), 8 bits For the blue color plane, the 5 repeated pixels (i.e., the last five pixels) of Line 3 indicated by the CF1 white space opcode "80" discussed above can be expressed as:

FF FF FF FF FF

After 32-bit word padding, these pixels can be represented as:

FF FF FF FF FF 00 00 00

Converting the above padded byte sequence to big-endian sequencing produces the following sequence of bytes:

FF FF FF FF 00 00 00 FF

CF2 compression of the above sequence of bytes using little endian sequencing can be expressed in hexadecimal format as follows:

3D 80 FE BF 00 00 C0 BF

The CF2 compression can include the following CF2 operations:

LITERAL_OP−0x200+0xFF, 10 bits
SHORT_MATCH_OP (0x3C)+repeat_count (3)−1, 6 bits
LITERAL_OP−0x200+0x0, 10 bits
SHORT_MATCH_OP (0x3C)+repeat_count (2)−1, 6 bits
LITERAL_OP−0x200+0xFF, 10 bits Conversion of Line 4 of CF1 Encoded Interleaved Color Data 432 to CF2

Line 4 of color matrix 410 is:

W G G G W B B W

Line 4 of color plane data 420, representing color matrix 410, starts with 1 white pixel that can be expressed in hexadecimal format as follows:

FF FF FF

Pixels 2, 3, and 4 of Line 4 of color plane data 420 represent 3 green pixels, which can be expressed in hexadecimal format as follows:

00 FF 00 00 FF 00 00 FF 00

Pixel 5 of Line 4 in color plane data 420 represents 1 white pixel that can be expressed in hexadecimal format as follows:

FF FF FF

Pixels 6 and 7 of Line 4 in color plane data 420 represent 2 blue pixels that can be expressed in hexadecimal format as follows:

00 00 FF 00 00 FF

Pixel 8 of Line 4 in color plane data 420 represents 1 white pixel that can be expressed in hexadecimal format as follows:

FF FF FF

CF1 encoded interleaved color data 432 indicates that these 8 pixels of Line 4 can be represented using first compression format CF1 in hexadecimal format as follows:

00 00 FF FF FF 02 00 FF 00 00 FF FF FF 01 00 00 FF 80

According to the first compression format CF1, the first byte of the above CF1 byte sequence can be interpreted as follows:

00—this line (Line 4) is not repeated.

In the context of method 450, the above "00" byte indicates that CC=0, and in this example, CF1 is encoding three-byte pixel values, so SZ=3. Then, the procedures of block 464 can determine that the remainder of the above CF1 byte sequence represents:

00—a first CF1 repeat data item opcode representing a run of length "00"+1=1

FF FF FF—a first repeat data item; in this case, a white pixel

02—a second CF1 repeat data item opcode representing a run of length "02"+1=3

00 FF 00—a second repeat data item; in this case, a green pixel

00—a third CF1 repeat data item opcode representing a run of length "00"+1=1

FF FF FF—a third repeat data item; in this case, a white pixel

01—a fourth CF1 repeat data item opcode representing a run of length "01"+1=2

00 00 FF—a fourth repeat data item, in this case a blue pixel

80—a CF1 white space opcode, indicating that the rest of the line includes white pixels.

In the embodiments illustrated in this Appendix, CF1 interleaved color data 432 is converted to the second compression format CF2 into three color plane outputs: one output for the red color plane, one output for the green color plane, and one output for the blue color plane. Then, the pixels of Line 4 can be represented in each of the red, green, and blue color planes as follows:

Red color plane FF 00 00 00 FF 00 00 FF
Green color plane FF FF FF FF FF 00 00 FF
Blue color plane FF 00 00 00 FF FF FF FF The first pixel of Line 4 of color matrix 420, which is a white pixel as indicated by the first CF1 repeat data item opcode "00" as discussed above, can appear in each of the red, green, and blue color planes as the following hexadecimal value:

FF

After 32-bit word padding, this pixel can be represented as:

FF 00 00 00

Converting the above padded byte sequence to big-endian sequencing produces the following sequence of bytes:

00 00 00 FF

CF2 compression of the above sequence of bytes using little endian sequencing can be expressed in hexadecimal format as follows:

C0 BF 3D 80 00 00 00 00

The CF2 compression can include the following CF2 operations:

LITERAL_OP–0x200+0x00, 10 bits
SHORT_MATCH_OP+repeat_count (2)–1, 6 bits
LITERAL_OP–0x200+0xFF, 10 bits
END_OF_LINE_OP (0), 8 bits Pixels 2, 3, and 4 of Line 4, which are 3 green pixels as indicated by the second CF1 repeat data item opcode "02" as discussed above, can be expressed in the red color plane as:

00 00 00

After 32-bit word padding, these pixels can be represented as:

00 00 00 00

The above byte sequence is not affected by big-endian conversion. Then, CF2 compression of the above sequence of bytes using little endian sequencing can be expressed in hexadecimal format as follows:

00 00 3E 80

The CF2 compression can include the following CF2 operations:

LITERAL_OP–0x200+0x00, 10 bits
SHORT_MATCH_OP+repeat_count (3)–1, 6 bits
END_OF_LINE_OP (0), 8 bits Pixels 2, 3, and 4 of Line 4, which are 3 green pixels as indicated by the second CF1 repeat data item opcode "02" as discussed above, can be expressed in the green color plane as:

FF FF FF

After 32-bit word padding, these pixels can be represented as:

FF FF FF 00

Converting the above padded byte sequence to big-endian sequencing produces the following sequence of bytes:

00 FF FF FF

CF2 compression of the above sequence of bytes using little endian sequencing can be expressed in hexadecimal format as follows:

40 FF 2F 80 00 00 00 00

The CF2 compression can include the following CF2 operations:

LITERAL_OP–0x200+0x00, 10 bits
LITERAL_OP–0x200+0xFF, 10 bits
SHORT_MATCH_OP+repeat_count (2)–1, 6 bits
END_OF_LINE_OP (0), 8 bits Pixels 2, 3, and 4 of Line 4, which are 3 green pixels as indicated by the second CF1 repeat data item opcode "02" as discussed above, can be expressed in the blue color plane as:

00 00 00

After 32-bit word padding, these pixels can be represented as:

00 00 00 00

The above byte sequence is not affected by big-endian conversion. Then, CF2 compression of the above sequence of bytes using little endian sequencing can be expressed in hexadecimal format as follows:

00 00 3E 80

The CF2 compression can include the following CF2 operations:

LITERAL_OP–0x200+0x00, 10 bits
SHORT_MATCH_OP+repeat_count (3)–1, 6 bits
END_OF_LINE_OP (0), 8 bits Pixel 5 of Line 4 is a white pixel as indicated by the third CF1 repeat data item opcode "00" as discussed above, can be expressed in hexadecimal format for each color plane as:

FF

After 32-bit word padding, this pixel can be represented as:

FF 00 00 00

Converting the above padded byte sequence to big-endian sequencing produces the following sequence of bytes:

00 00 00 FF

CF2 compression of the above sequence of bytes using little endian sequencing can be expressed in hexadecimal format as follows:

C0 BF 3D 80 00 00 00 00

The CF2 compression can include the following CF2 operations:

LITERAL_OP–0x200+0x00, 10 bits
SHORT_MATCH_OP+repeat_count (2)–1, 6 bits
LITERAL_OP–0x200+0xFF, 10 bits
END_OF_LINE_OP (0), 8 bits Pixels 6 and 7 of Line 4, which are 2 blue pixels as indicated by the fourth CF1 repeat data item opcode "01" as discussed above, can be expressed in hexadecimal format for the red color plane as follows:

00 00

After 32-bit word padding, these pixels can be represented as:

00 00 00 00

The above byte sequence is not affected by big-endian conversion. Then, CF2 compression of the above sequence of bytes using little endian sequencing can be expressed in hexadecimal format as follows:

00 00 3E 80

The CF2 compression can include the following CF2 operations:

LITERAL_OP–0x200+0x00, 10 bits
SHORT_MATCH_OP+repeat_count (3)–1, 6 bits
END_OF_LINE_OP (0), 8 bits Pixels 6 and 7 of Line 4, which are 2 blue pixels as indicated by the fourth CF1 repeat data item opcode "01" as discussed above, can be expressed in hexadecimal format for the green color plane as follows:

00 00

After 32-bit word padding, these pixels can be represented as:

00 00 00 00

The above byte sequence is not affected by big-endian conversion. Then, CF2 compression of the above sequence of bytes using little endian sequencing can be expressed in hexadecimal format as follows:

00 00 3E 80

The CF2 compression can include the following CF2 operations:

LITERAL_OP–0x200+0x00, 10 bits
SHORT_MATCH_OP+repeat_count (3)–1, 6 bits
END_OF_LINE_OP (0), 8 bits Pixels 6 and 7 of Line 4, which are 2 blue pixels as indicated by the fourth CF1 repeat data item opcode "01" as discussed above, can be expressed in hexadecimal format for the blue color plane as follows:

FF FF

After 32-bit word padding, these pixels can be represented as:

FF FF 00 00

Converting the above padded byte sequence to big-endian sequencing produces the following sequence of bytes:

00 00 FF FF

CF2 compression of the above sequence of bytes using little endian sequencing can be expressed in hexadecimal format as follows:

FC BF 3C 80 00 00 00 00

The CF2 compression can include the following CF2 operations:

LITERAL_OP–0x200+0x00, 10 bits
SHORT_MATCH_OP+repeat_count (1)–1, 6 bits
LITERAL_OP–0x200+0xFF, 10 bits
SHORT_MATCH_OP+repeat_count (1)–1, 6 bits
END_OF_LINE_OP (0), 8 bits The eighth and last pixel of Line 4 of color matrix 420, which is a white pixel as indicated by the "80" CF1 white space opcode discussed above, can appear in each of the red, green, and blue color planes as the following hexadecimal value:

FF

After 32-bit word padding, this pixel can be represented as:

FF 00 00 00

Converting the above padded byte sequence to big-endian sequencing produces the following sequence of bytes:

00 00 00 FF

CF2 compression of the above sequence of bytes using little endian sequencing can be expressed in hexadecimal format as follows:

C0 BF 3D 80 00 00 00 00

The CF2 compression can include the following CF2 operations:

LITERAL_OP–0x200+0x00, 10 bits
SHORT_MATCH_OP+repeat_count (2)–1, 6 bits
LITERAL_OP–0x200+0xFF, 10 bits
END_OF_LINE_OP (0), 8 bits Conversion of Line 5 of CF1 Encoded Interleaved Color Data 432 to CF2

Line 5 of color matrix 410 is:

Y Y Y W R R R W

Line 5 of color plane data 420, representing color matrix 410, starts with 3 yellow pixels that can be expressed in hexadecimal format as follows:

FF FF 00 FF FF 00 FF FF 00

Pixel 4 of Line 5 in color plane data 420 represents 1 white pixel that can be expressed in hexadecimal format as follows:

FF FF FF

Pixels 5, 6, and 7 of Line 5 of color plane data 420 represent 3 red pixels, which can be expressed in hexadecimal format as follows:

FF 00 00 FF 00 00 FF 00 00

Pixel 8 of Line 5 in color plane data 420 represents 1 white pixel that can be expressed in hexadecimal format as follows:

FF FF FF

CF1 encoded interleaved color data 432 indicates that these 8 pixels of Line 5 can be represented using first compression format CF1 in hexadecimal format as follows:

00 02 FF FF 00 00 FF FF 02 FF 00 00 80

According to the first compression format CF1, the first byte of the above CF1 byte sequence can be interpreted as follows:

00—this line (Line 5) is not repeated.

In the context of method 450, the above "00" byte indicates that CC=0, and in this example, CF1 is encoding three-byte pixel values, so SZ=3. Then, the procedures of block 464 can determine that the remainder of the above CF1 byte sequence represents:

02—a CF1 first repeat data item opcode representing a run of length "02"+1=3

FF FF 00—a first repeat data item; in this case, a yellow pixel

00—a second CF1 repeat data item opcode representing a run of length "00"+1=1

FF FF FF—a second repeat data item; in this case, a white pixel

02—a third CF1 repeat data item opcode representing a run of length "02"+1=3

FF 00 00—a third repeat data item; in this case, a red pixel

80—a CF1 white space opcode, indicating that the rest of the line includes white pixels.

In the embodiments illustrated in this Appendix, CF1 interleaved color data 432 is converted to the second compression format CF2 into three color plane outputs: one output for the red color plane, one output for the green color plane, and one output for the blue color plane. Then, the eight repeated blue pixels of Line 5 can be represented in each of the red, green, and blue color planes as follows:

Red color plane FF FF FF FF FF FF FF FF
Green color plane FF FF FF FF 00 00 00 FF
Blue color plane 00 00 00 FF 00 00 00 FF Pixels 1, 2, and 3 of Line 5, which are 3 yellow pixels as indicated by the first CF1 repeat data item opcode "02" as discussed above, can be expressed in the red color plane as:

FF FF FF

After 32-bit word padding, these pixels can be represented as:

FF FF FF 00

Converting the above padded byte sequence to big-endian sequencing produces the following sequence of bytes:

00 FF FF FF

CF2 compression of the above sequence of bytes using little endian sequencing can be expressed in hexadecimal format as follows:

40 FF 2F 80 00 00 00 00

The CF2 compression can include the following CF2 operations:

LITERAL_OP−0x200+0x00, 10 bits
LITERAL_OP−0x200+0xFF, 10 bits
SHORT_MATCH_OP+repeat_count (2)−1, 6 bits
END_OF_LINE_OP (0), 8 bits Pixels 1, 2, and 3 of Line 5, which are 3 yellow pixels as indicated by the first CF1 repeat data item opcode "02" discussed above, can be expressed in the green color plane as:

FF FF FF

After 32-bit word padding, these pixels can be represented as:

FF FF FF 00

Converting the above padded byte sequence to big-endian sequencing produces the following sequence of bytes:

00 FF FF FF

CF2 compression of the above sequence of bytes using little endian sequencing can be expressed in hexadecimal format as follows:

40 FF 2F 80 00 00 00 00

The CF2 compression can include the following CF2 operations:

LITERAL_OP−0x200+0x00, 10 bits
LITERAL_OP−0x200+0xFF, 10 bits
SHORT_MATCH_OP+repeat_count (2)−1, 6 bits
END_OF_LINE_OP (0), 8 bits Pixels 1, 2, and 3 of Line 5, which are 3 yellow pixels as indicated by the first CF1 repeat data item opcode "02" discussed above, can be expressed in the blue color plane as:

00 00 00

After 32-bit word padding, these pixels can be represented as:

00 00 00 00

The above byte sequence is not affected by big-endian conversion. Then, CF2 compression of the above sequence of bytes using little endian sequencing can be expressed in hexadecimal format as follows:

00 00 3E 80

The CF2 compression can include the following CF2 operations:

LITERAL_OP−0x200+0x00, 10 bits
SHORT_MATCH_OP+repeat_count (3)−1, 6 bits
END_OF_LINE_OP (0), 8 bits Pixel 4 of Line 5 in color matrix 420, which is a white pixel as indicated by the second CF1 repeat data item opcode "00" discussed above, can appear in each of the red, green, and blue color planes as the following hexadecimal value:

FF

After 32-bit word padding, this pixel can be represented as:

FF 00 00 00

Converting the above padded byte sequence to big-endian sequencing produces the following sequence of bytes:

00 00 00 FF

CF2 compression of the above sequence of bytes using little endian sequencing can be expressed in hexadecimal format as follows:

C0 BF 3D 80 00 00 00 00

The CF2 compression can include the following CF2 operations:

LITERAL_OP−0x200+0x00, 10 bits
SHORT_MATCH_OP+repeat_count (2)−1, 6 bits
LITERAL_OP−0x200+0xFF, 10 bits
END_OF_LINE_OP (0), 8 bits Pixels 5, 6, and 7, which are 3 red pixels as indicated by the third CF1 repeat data item opcode "02" discussed above, can be expressed in the red color plane as:

FF FF FF

After 32-bit word padding, these pixels can be represented as:

FF FF FF 00

Converting the above padded byte sequence to big-endian sequencing produces the following sequence of bytes:

00 FF FF FF

CF2 compression of the above sequence of bytes using little endian sequencing can be expressed in hexadecimal format as follows:

40 FF 2F 80 00 00 00 00

The CF2 compression can include the following CF2 operations:

LITERAL_OP−0x200+0x00, 10 bits
LITERAL_OP−0x200+0xFF, 10 bits
SHORT_MATCH_OP+repeat_count (2)−1, 6 bits
END_OF_LINE_OP (0), 8 bits Pixels 5, 6, and 7 of Line 5, which are 3 red pixels as indicated by the third CF1 repeat data item opcode "02" discussed above, can be expressed in the green color plane as:
00 00 00
After 32-bit word padding, these pixels can be represented as:
00 00 00 00
The above byte sequence is not affected by big-endian conversion. Then, CF2 compression of the above sequence of bytes using little endian sequencing can be expressed in hexadecimal format as follows:
00 00 3E 80
The CF2 compression can include the following CF2 operations:
LITERAL_OP–0x200+0x00, 10 bits
SHORT_MATCH_OP+repeat_count (3)–1, 6 bits
END_OF_LINE_OP (0), 8 bits
Pixels 5, 6, and 7 of Line 5, which are 3 red pixels as indicated by the third CF1 repeat data item opcode "02" discussed above, can be expressed in the blue color plane as:
00 00 00
After 32-bit word padding, these pixels can be represented as:
00 00 00 00
The above byte sequence is not affected by big-endian conversion. Then, CF2 compression of the above sequence of bytes using little endian sequencing can be expressed in hexadecimal format as follows:
00 00 3E 80
The CF2 compression can include the following CF2 operations:
LITERAL_OP–0x200+0x00, 10 bits
SHORT_MATCH_OP+repeat_count (3)–1, 6 bits
END_OF_LINE_OP (0), 8 bits
Pixel 8 of Line 5 in color matrix 420, which is a white pixel as indicated by the CF1 white space opcode "80" discussed above, can appear in each of the red, green, and blue color planes as the following hexadecimal value:
FF
After 32-bit word padding, this pixel can be represented as:
FF 00 00 00
Converting the above padded byte sequence to big-endian sequencing produces the following sequence of bytes:
00 00 00 FF
CF2 compression of the above sequence of bytes using little endian sequencing can be expressed in hexadecimal format as follows:
C0 BF 3D 80 00 00 00 00
The CF2 compression can include the following CF2 operations:
LITERAL_OP–0x200+0x00, 10 bits
SHORT_MATCH_OP+repeat_count (2)–1, 6 bits
LITERAL_OP–0x200+0xFF, 10 bits
END_OF_LINE_OP (0), 8 bits
Conversion of Line 6 of CF1 Encoded Interleaved Color Data 432 to CF2
Line 6 of color matrix 410 is:
B B B B B B B B
Line 6 of color plane data 420, representing color matrix 410, includes 8 blue pixels that can be expressed in hexadecimal format as follows:
00 00 FF 00 00 FF 00 00 FF 00 00 FF 00 00 FF 00 00 FF 00 00 FF 00 00 FF CF1 encoded interleaved color data 432 indicates that these 8 pixels of Line 6 can be represented using first compression format CF1 in hexadecimal format as follows:
00 07 00 00 FF
According to the first compression format CF1, the first byte of the above CF1 byte sequence can be interpreted as follows:
00—this line (Line 6) is not repeated.
In the context of method 450, the above "00" byte indicates that CC=0, and in this example, CF1 is encoding three-byte pixel values, so SZ=3. Then, the procedures of block 464 can determine that the remainder of the above CF1 byte sequence represents:
07—a CF1 repeat data items opcode representing a run of length "07"+1=8 data items
00 00 FF—the repeat data items (in this case, 8 repeated blue pixels)
In the embodiments illustrated in this Appendix, CF1 interleaved color data 432 is converted to the second compression format CF2 into three color plane outputs: one output for the red color plane, one output for the green color plane, and one output for the blue color plane. Then, the eight repeated blue pixels of Line 6 can be represented in each of the red, green, and blue color planes as follows:
Red color plane 00 00 00 00 00 00 00 00
Green color plane 00 00 00 00 00 00 00 00
Blue color plane FF FF FF FF FF FF FF FF
The 8 red pixels in Line 6 indicated by the CF1 repeat data items opcode "07" as discussed above can be expressed for the red color plane using hexadecimal format as follows:
00 00 00 00 00 00 00 00
The above sequence of bytes is not affected by 32-bit padding or big-endian conversion. CF2 compression of the above sequence of bytes using little endian sequencing can be expressed in hexadecimal format as follows:
C0 00 3F 80 00 00 00 00
The CF2 compression can include the following CF2 operations:
LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits
The 8 green pixels in Line 6 indicated by the CF1 repeat data items opcode "07" as discussed above can be expressed for the green color plane using hexadecimal format as follows:
00 00 00 00 00 00 00 00
The above sequence of bytes is not affected by 32-bit padding or big-endian conversion. CF2 compression of the above sequence of bytes using little endian sequencing can be expressed in hexadecimal format as follows:
C0 00 3F 80 00 00 00 00
The CF2 compression can include the following CF2 operations:
LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits
The 8 blue pixels in Line 6 indicated by the CF1 repeat data items opcode "07" as discussed above can be expressed for the blue color plane using hexadecimal format as follows:
FF FF FF FF FF FF FF FF
The above sequence of bytes is not affected by 32-bit padding or big-endian conversion. CF2 compression of the above sequence of bytes using little endian sequencing can be expressed in hexadecimal format as follows:

C0 00 FF BF 00 00 00 00

The CF2 compression can include the following CF2 operations:

LITERAL_OP–0x200+0xFF, 10 bits
LONG_MATCH_OPCODE (0xFC00)+repeat count (7)–MATCH_SHORT_MATCH_RUN_LENGTH (4), 16 bits
END_OF_LINE_OP (0), 8 bits Conversion of Line 7 of CF1 Encoded Interleaved Color Data 432 to CF2

Line 7 of color matrix 410 is:

G G G G G G G G

Line 7 of color plane data 420, representing color matrix 410, includes 8 green pixels that can be expressed in hexadecimal format as follows:

00 FF 00 00 FF 00 00 FF 00 00 FF 00 00 FF 00 00 FF 00 00 FF 00 00 FF 00

CF1 encoded interleaved color data 432 indicates that these 8 pixels of Line 7 can be represented using first compression format CF1 in hexadecimal format as follows:

00 07 00 FF 00

According to the first compression format CF1, the first byte of the above CF1 byte sequence can be interpreted as follows:

00—this line (Line 7) is not repeated.

In the context of method 450, the above "00" byte indicates that CC=0, and in this example, CF1 is encoding three-byte pixel values, so SZ=3. Then, the procedures of block 464 can determine that the remainder of the above CF1 byte sequence represents:

07—a CF1 repeat data items opcode representing a run of length "07"+1=8 data items 00 FF 00—the repeat data items (in this case, 8 repeated green pixels)

In the embodiments illustrated in this Appendix, CF1 interleaved color data 432 is converted to the second compression format CF2 into three color plane outputs: one output for the red color plane, one output for the green color plane, and one output for the blue color plane. Then, the eight repeated green pixels of Line 7 can be represented in each of the red, green, and blue color planes as follows:

Red color plane 00 00 00 00 00 00 00 00
Green color plane FF FF FF FF FF FF FF FF
Blue color plane 00 00 00 00 00 00 00 00

The 8 red pixels in Line 7 indicated by the CF1 repeat data items opcode "07" as discussed above can be expressed for the red color plane using hexadecimal format as follows:

00 00 00 00 00 00 00 00

The above sequence of bytes is not affected by 32-bit padding or big-endian conversion. CF2 compression of the above sequence of bytes using little endian sequencing can be expressed in hexadecimal format as follows:

C0 00 3F 80 00 00 00 00

The CF2 compression can include the following CF2 operations:

LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits The 8 green pixels in Line 7 indicated by the CF1 repeat data items opcode "07" as discussed above can be expressed for the green color plane using hexadecimal format as follows:

FF FF FF FF FF FF FF FF

The above sequence of bytes is not affected by 32-bit padding or big-endian conversion. CF2 compression of the above sequence of bytes using little endian sequencing can be expressed in hexadecimal format as follows:

C0 00 FF BF 00 00 00 00

The CF2 compression can include the following CF2 operations:

LITERAL_OP–0x200+0xFF, 10 bits
LONG_MATCH_OPCODE (0xFC00)+repeat count (7)–MATCH_SHORT_MATCH_RUN_LENGTH (4), 16 bits
END_OF_LINE_OP (0), 8 bits The 8 blue pixels in Line 7 indicated by the CF1 repeat data items opcode "07" as discussed above can be expressed for the blue color plane using hexadecimal format as follows:

00 00 00 00 00 00 00 00

The above sequence of bytes is not affected by 32-bit padding or big-endian conversion. CF2 compression of the above sequence of bytes using little endian sequencing can be expressed in hexadecimal format as follows:

C0 00 3F 80 00 00 00 00

The CF2 compression can include the following CF2 operations:

LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits Conversion of Line 8 of CF1 Encoded Interleaved Color Data 432 to CF2

Line 8 of color matrix 410 is:

R R R R R R R R

Line 8 of color plane data 420, representing color matrix 410, includes 8 red pixels that can be expressed in hexadecimal format as follows:

FF 00 00 FF 00 00 FF 00 00 FF 00 00 FF 00 00 FF 00 00 FF 00 00 FF 00 00

CF1 encoded interleaved color data 432 indicates that these 8 pixels of Line 8 can be represented using first compression format CF1 in hexadecimal format as follows:

00 07 FF 00 00

According to the first compression format CF1, the first byte of the above CF1 byte sequence can be interpreted as follows:

00—this line (Line 8) is not repeated

In the context of method 450, the above "00" byte indicates that CC=0, and in this example, CF1 is encoding three-byte pixel values, so SZ=3. Then, the procedures of block 464 can determine that the remainder of the above CF1 byte sequence represents:

07—a CF1 repeat data items opcode representing a run of length "07"+1=8 data items FF 00 00—the repeat data items (in this case, 8 repeated red pixels)

In the embodiments illustrated in this Appendix, CF1 interleaved color data 432 is converted to the second compression format CF2 into three color plane outputs: one output for the red color plane, one output for the green color plane, and one output for the blue color plane. Then, the eight repeated red pixels of Line 8 can be represented in each of the red, green, and blue color planes as follows:

Red color plane FF FF FF FF FF FF FF FF
Green color plane 00 00 00 00 00 00 00 00
Blue color plane 00 00 00 00 00 00 00 00

The 8 red pixels in Line 8 indicated by the CF1 repeat data items opcode "07" as discussed above can be expressed for the red color plane using hexadecimal format as follows:

FF FF FF FF FF FF FF FF

The above sequence of bytes is not affected by 32-bit padding or big-endian conversion. CF2 compression of the above sequence of bytes using little endian sequencing can be expressed in hexadecimal format as follows:

C0 00 FF BF 00 00 00 00

The CF2 compression can include the following CF2 operations:

LITERAL_OP–0x200+0xFF, 10 bits
LONG_MATCH_OPCODE (0xFC00)+repeat count (7)–MATCH_SHORT_MATCH_RUN_LENGTH (4), 16 bits
END_OF_LINE_OP (0), 8 bits The 8 green pixels in Line 8 indicated by the CF1 repeat data items opcode "07" as discussed above can be expressed for the green color plane using hexadecimal format as follows:

00 00 00 00 00 00 00 00

The above sequence of bytes is not affected by 32-bit padding or big-endian conversion. CF2 compression of the above sequence of bytes using little endian sequencing can be expressed in hexadecimal format as follows:

C0 00 3F 80 00 00 00 00

The CF2 compression can include the following CF2 operations:

LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits The 8 blue pixels in Line 8 indicated by the CF1 repeat data items opcode "07" as discussed above can be expressed for the blue color plane using hexadecimal format as follows:

00 00 00 00 00 00 00 00

The above sequence of bytes is not affected by 32-bit padding or big-endian conversion. CF2 compression of the above sequence of bytes using little endian sequencing can be expressed in hexadecimal format as follows:

C0 00 3F 80 00 00 00 00

The CF2 compression can include the following CF2 operations:

LITERAL_OP–0x200+0x00, 10 bits
LONG_MATCH_OPCODE (0xFC00)+repeat count (7)–MATCH_SHORT_MATCH_RUN_LENGTH (4), 16 bits
END_OF_LINE_OP (0), 8 bits After completing the procedures for converting Line 8 to second compression format CF2, the example can be completed.

What is claimed is:

1. A method, comprising:
    receiving image data encoded using a first run-length encoded format, wherein the image data comprises one or more lines of pixels, and wherein the first run-length encoded format comprises a repeated-line code specifying a repeat count;
    performing a conversion of the image data from the first run-length encoded format to a second run-length encoded format, wherein the second run-length encoded format differs from the first run-length encoded format, and wherein performing the conversion comprises:
        for a designated input line of the image data encoded in the first run-length encoded format, determining whether the repeat count for the designated input line is greater than one; and
        after determining that the repeat count is greater than one,
            generating a designated output line that is encoded in the second run-length encoded format and that corresponds to the designated input line, and
            duplicating the designated output line a number of times, wherein the number of times is based on the repeat count; and
    providing an output comprising the image data encoded in the second run-length encoded format.

2. The method of claim 1, wherein the first run-length encoded format comprises an end-of-line code indicating that a remainder of the pixels in a particular line of the one or more lines of pixels has a predetermined value.

3. The method of claim 1, wherein the second run-length encoded format comprises a plurality of codes, and wherein the plurality of codes comprise:
    a literal code indicating a specific value of image data;
    a match code indicating a number of matching values of image data; and
    a near match code indicating a successor value of image data is within a predetermined range of values of a predecessor value of the image data.

4. The method of claim 3, wherein the specific value of image data, the matching values, the successor value and the predecessor value are each based on pixels of the image data.

5. The method of claim 3, wherein the first run-length encoded format comprises a repeated-pixel code indicating a designated pixel is repeated a designated number of times, and wherein performing the conversion further comprises:
    reading an input code from the image data encoded using the first run-length encoded format, wherein the input code is associated with a particular line of the one or more lines of pixels;
    determining whether the input code is the repeated-pixel code; and
    after determining that the code is the repeated-pixel code, generating a portion of the conversion comprising the literal code.

6. The method of claim 5, wherein generating the portion of the conversion comprises:
    generating a first portion of the conversion comprising the literal code and the designated pixel;
    determining whether the designated number of times the designated pixel is repeated exceeds one; and
    after determining that the designated number of times exceeds one, generating a second portion of the conversion comprising the match code.

7. The method of claim 6, wherein the match code is selected from a short match code or a long match code, and wherein generating the second portion of the conversion comprises:
    determining whether the designated number of times exceeds a long-match threshold; and
    after determining that the designated number of times does exceed the long-match threshold, generating the second portion of the conversion that comprises the long match code.

8. The method of claim 7, wherein generating the second portion of the conversion comprises:

after determining that the designated number of times does not exceed the long-match threshold, generating the second portion of the conversion that comprises the short match code.

9. The method of claim 1, wherein the pixels of the image data are separable into image data for a plurality of color planes of image data, and the image data encoded in the second run-length encoded format comprises a first portion corresponding to a first color plane of the plurality of color planes and a second portion corresponding to a second color plane of the plurality of color planes, wherein the first portion is separable from the second portion, and wherein the first and second color planes differ.

10. The method of claim 1, wherein the pixels of the image data are separable into image data for a plurality of color planes of image data, and the image data encoded in the second run-length encoded format intermingles the image data for the plurality of color planes.

11. A computing device, comprising:
one or more processors; and
data storage configured to store computer-readable instructions that, when executed by the one or more processors, cause the computing device to perform functions comprising:
receiving image data encoded using a first run-length encoded format, wherein the image data comprises one or more lines of pixels, and wherein the first run-length encoded format comprises a repeated-line code specifying a repeat count;
performing a conversion of the image data from the first run-length encoded format to a second run-length encoded format, wherein the second run-length encoded format differs from the first run-length encoded format, and wherein performing the conversion comprises:
for a designated input line of the image data encoded in the first run-length encoded format, determining whether the repeat count for the designated input line is greater than one; and
after determining that the repeat count is greater than one,
generating a designated output line that is encoded in the second run-length encoded format and that corresponds to the designated input line, and
duplicating the designated output line a number of times, wherein the number of times is based on the repeat count; and
providing an output comprising the image data encoded in the second run-length encoded format.

12. The computing device of claim 11, further comprising:
a communications interface to a second computing device that is configured to decode the image data encoded in the second run-length encoded format; and
wherein providing the output comprises communicating the output comprising the image data encoded in the second run-length encoded format to the second computing device via the communications interface.

13. The computing device of claim 11, wherein the second run-length encoded format comprises a plurality of codes, and wherein the plurality of codes comprise:
a literal code indicating a specific value of image data;
a match code indicating a number of matching values of image data; and
a near match code indicating a successor value of image data is within a predetermined range of values of a predecessor value of the image data.

14. The computing device of claim 12, wherein the first run-length encoded format comprises a repeated-pixel code indicating a designated pixel is repeated a designated number of times, and wherein performing the conversion further comprises:
reading an input code from the image data encoded using the first run-length encoded format, wherein the input code is associated with a particular line of the one or more lines of pixels;
determining whether the input code is the repeated-pixel code; and
after determining that the code is the repeated-pixel code, generating a portion of the conversion comprising the literal code.

15. The computing device of claim 14, wherein generating the portion of the conversion comprises:
generating a first portion of the conversion comprising the literal code and the designated pixel;
determining whether the designated number of times the designated pixel is repeated exceeds one; and
after determining that the designated number of times exceeds one, generating a second portion of the conversion comprising the match code.

16. The computing device of claim 15, wherein the match code is selected from a short match code or a long match code, and wherein generating the second portion of the conversion comprises:
determining whether the designated number of times exceeds a long-match threshold;
after determining that the designated number of times does exceed the long-match threshold, generating the second portion of the conversion that comprises the long match code.

17. The computing device of claim 16, wherein generating the second portion of the conversion comprises:
after determining that the designated number of times does not exceed the long-match threshold, generating the second portion of the conversion that comprises the short match code.

18. The computing device of claim 11, wherein the pixels of the image data are separable into image data for a plurality of color planes of image data, and the image data encoded in the second run-length encoded format comprises a first portion corresponding to a first color plane of the plurality of color planes and a second portion corresponding to a second color plane of the plurality of color planes, wherein the first portion is separable from the second portion, and wherein the first and second color planes differ.

19. The computing device of claim 11, wherein the pixels of the image data are separable into image data for a plurality of color planes of image data, and the image data encoded in the second run-length encoded format intermingles the image data for the plurality of color planes.

20. An article of manufacture comprising a non-transitory computer readable medium configured to store computer-readable instructions that, when executed by one or more processors of a computing device, cause the computing device to perform functions comprising:
receiving image data encoded using a first run-length encoded format, wherein the image data comprises one or more lines of pixels, and wherein the first run-length encoded format comprises a repeated-line code specifying a repeat count;

performing a conversion of the image data from the first run-length encoded format to a second run-length encoded format, wherein the second run-length encoded format differs from the first run-length encoded format, and wherein performing the conversion comprises:

for a designated input line of the image data encoded in the first run-length encoded format, determining whether the repeat count for the designated input line is greater than one; and after determining that the repeat count is greater than one,
  generating a designated output line that is encoded in the second run-length encoded format and that corresponds to the designated input line, and
  duplicating the designated output line a number of times, wherein the number of times is based on the repeat count; and providing an output comprising the image data encoded in the second run-length encoded format.

* * * * *